United States Patent
Chen et al.

(10) Patent No.: US 10,153,051 B1
(45) Date of Patent: Dec. 11, 2018

(54) PROGRAM-VERIFY OF SELECT GATE TRANSISTOR WITH DOPED CHANNEL IN NAND STRING

(71) Applicant: SanDisk Technologies LLC, Plano, TX (US)

(72) Inventors: Hong-Yan Chen, San Jose, CA (US); Yingda Dong, San Jose, CA (US); Yen-Lung Li, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/879,044

(22) Filed: Jan. 24, 2018

(51) Int. Cl.
| | | |
|---|---|---|
| *G11C 11/34* | (2006.01) | |
| *G11C 16/34* | (2006.01) | |
| *G11C 16/26* | (2006.01) | |
| *G11C 16/04* | (2006.01) | |

(52) U.S. Cl.
CPC ...... *G11C 16/3459* (2013.01); *G11C 16/0483* (2013.01); *G11C 16/26* (2013.01)

(58) Field of Classification Search
CPC ............ G11C 16/3454; G11C 16/3459; G11C 11/5628; G11C 16/0483; G11C 2211/5621
USPC ....................................... 365/185.22, 185.18
See application file for complete search history.

(56) References Cited

U.S. PATENT DOCUMENTS

| | | | |
|---|---|---|---|
| 7,471,567 B1 | 12/2008 | Lee et al. | |
| 7,782,674 B2 | 8/2010 | Roohparvar et al. | |
| 8,867,271 B2 | 10/2014 | Li et al. | |
| 8,913,432 B2 | 12/2014 | Dong et al. | |
| 9,123,425 B2 | 9/2015 | Dong et al. | |
| 9,202,579 B2 | 12/2015 | Hsiung et al. | |
| 9,406,690 B2 | 8/2016 | Pang et al. | |
| 2010/0149875 A1* | 6/2010 | Ajika ................. | G11C 16/3436 365/185.11 |
| 2014/0169095 A1 | 6/2014 | Avila et al. | |

* cited by examiner

*Primary Examiner* — Son Dinh
(74) *Attorney, Agent, or Firm* — Vierra Magen Marcus LLP

(57) ABSTRACT

A memory device and associated techniques for programming a select gate transistor. The programming of the select gate transistors in a NAND string is performed under similar biasing as is seen during the programming of a memory cell, when the select gate transistors are required to be in the conductive or non-conductive state for selected and unselected NAND strings, respectively. Program-verify tests for the select gate transistors use a current which flows from the source end to the drain end of the NAND string, and can be performed separately for odd- and even-numbered NAND strings, to avoid the effects of bit line-to-bit line coupling. The tests account for uneven doping in the channel of the select gate transistor. Program-verify tests for the memory cells use a current which flows from the drain end to the source end and can be performed concurrently.

20 Claims, 19 Drawing Sheets

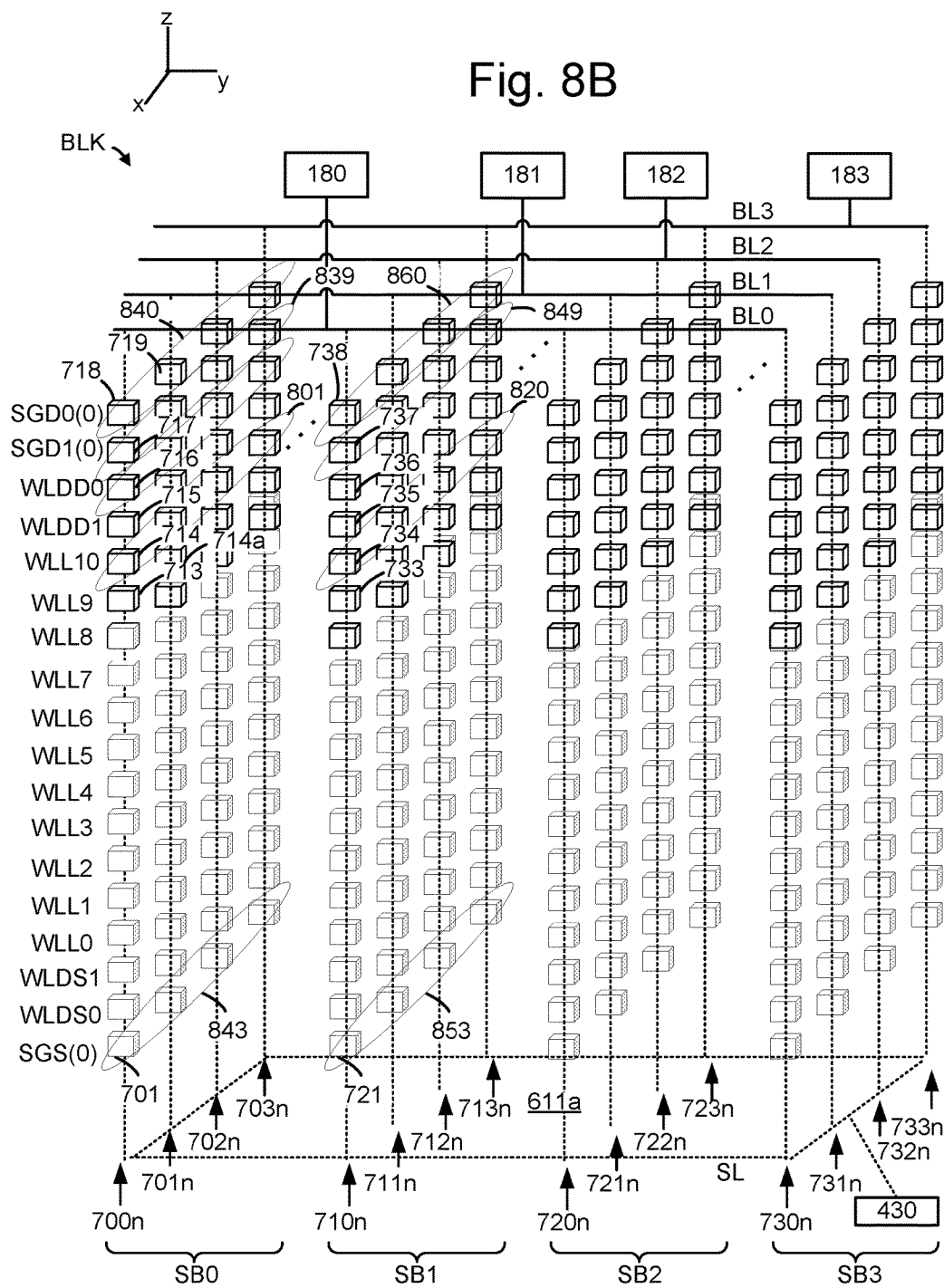

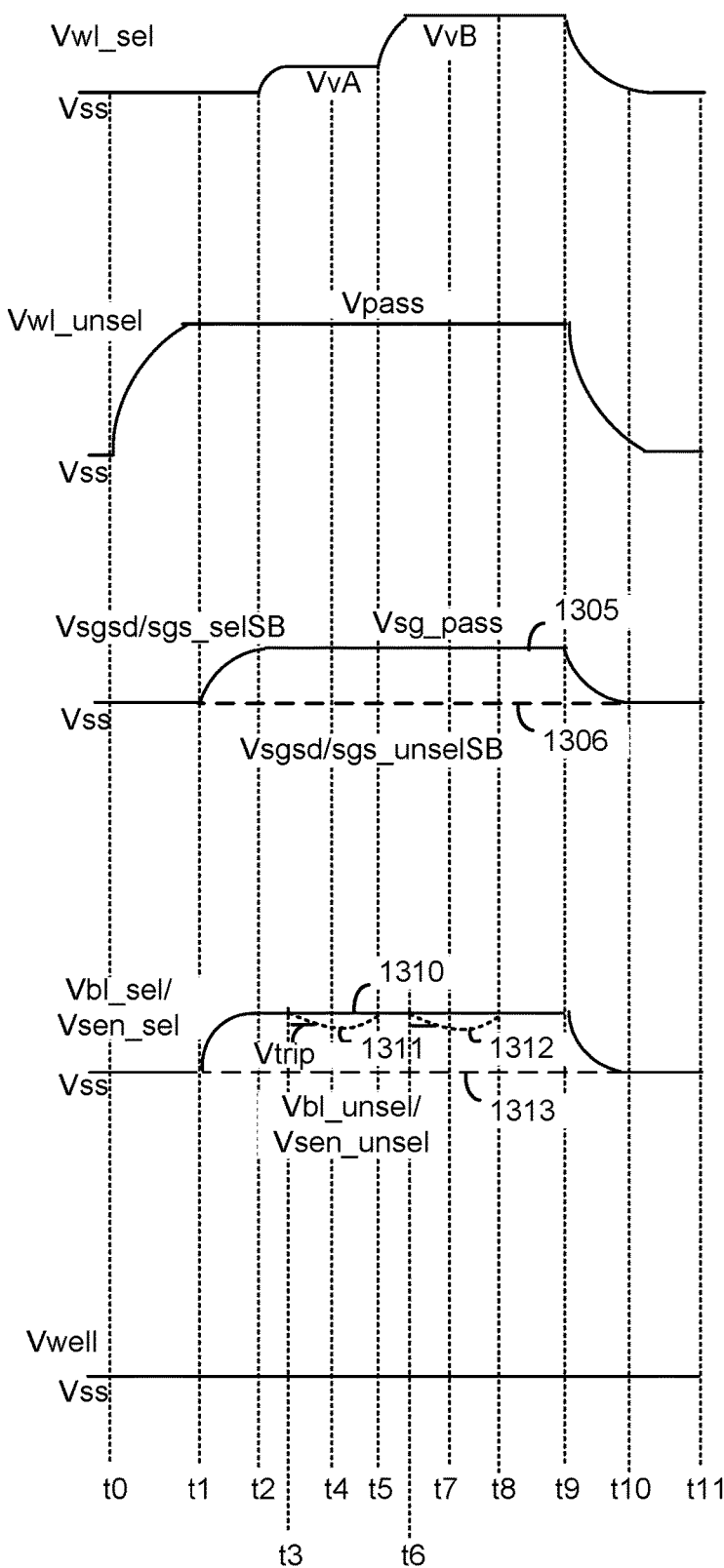

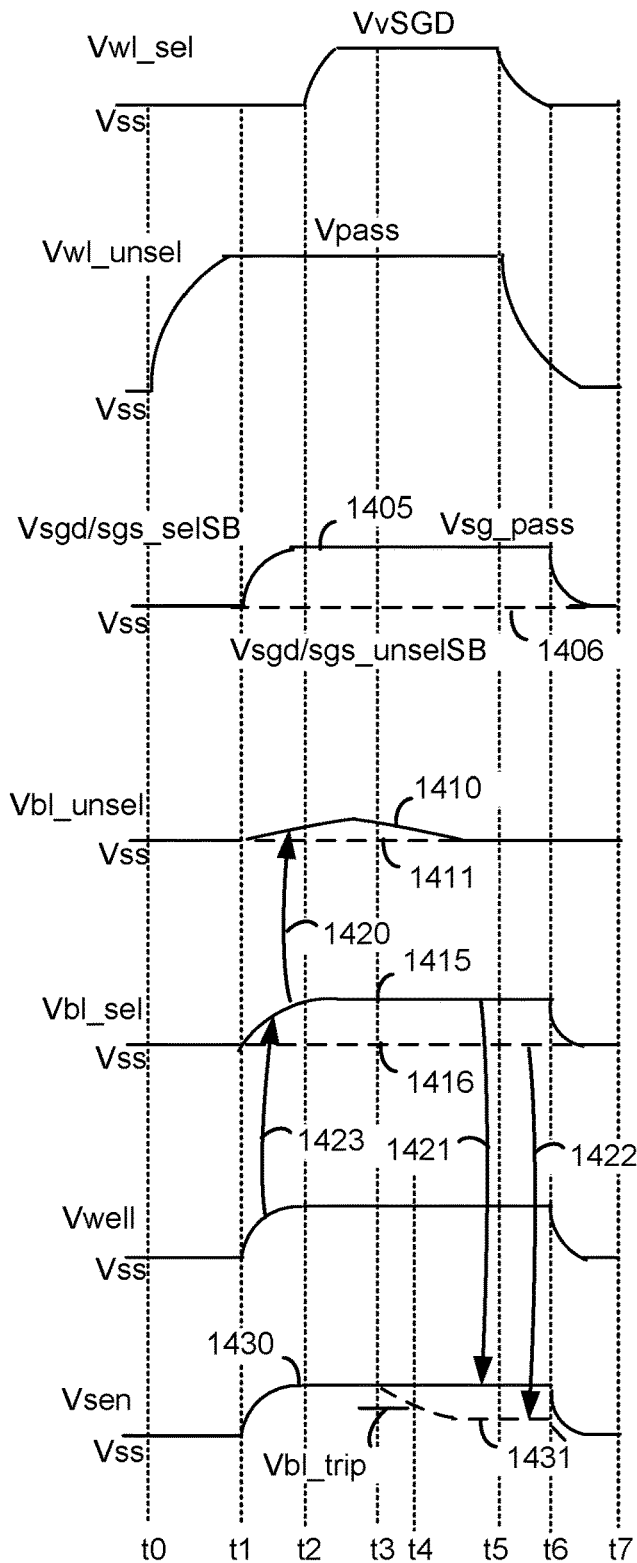

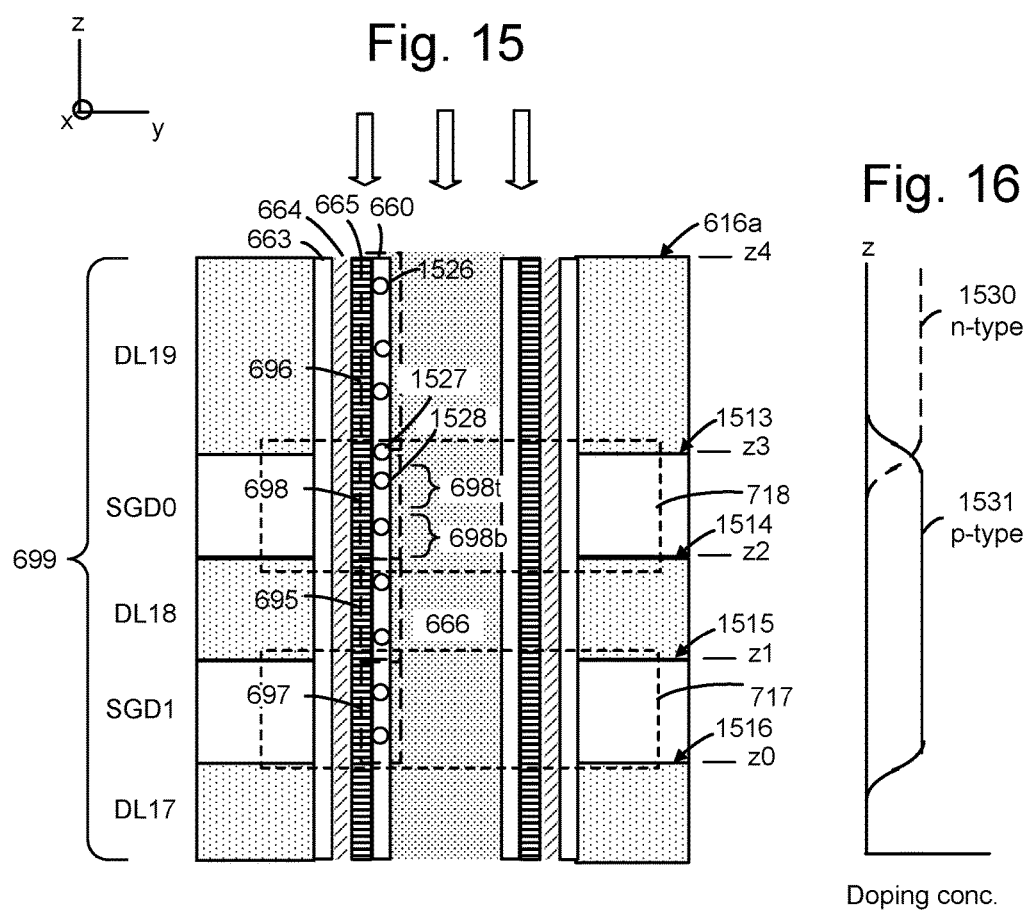

US 10,153,051 B1

PROGRAM-VERIFY OF SELECT GATE TRANSISTOR WITH DOPED CHANNEL IN NAND STRING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 8B depicts additional detail of the sub-blocks SB0-SB3 of FIG. 7.

FIG. 13A to 13E depict voltages in a program operation for memory cells, consistent with the process of FIGS. 12B and 12D.

FIG. 13A depicts a voltage of a selected word line.
FIG. 13B depicts a voltage of unselected word lines.
FIG. 13C depicts a voltage of select gate transistors.
FIG. 13D depicts a voltage of bit lines and sense nodes.
FIG. 13E depicts a voltage of a well region of a substrate.

FIG. 14A to 14G depict voltages in a program operation for select gate transistors, consistent with the process of FIGS. 12A and 12C.

FIG. 14A depicts a voltage of a selected word line.
FIG. 14B depicts a voltage of unselected word lines.
FIG. 14C depicts a voltage of select gate transistors.
FIG. 14D depicts a voltage of unselected bit lines.
FIG. 14E depicts a voltage of a selected bit line.
FIG. 14F depicts a voltage of a well region of a substrate.
FIG. 14G depicts a voltage of a sense node.

FIG. 15 depicts the region 699 of a stack of FIG. 6C, showing the implantation of dopants into the channel layer.

FIG. 16 depicts a plot of height in a stack versus dopant concentration, consistent with FIG. 15.

DETAILED DESCRIPTION

Apparatuses and techniques are described for programming a select gate transistor of a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 10A:
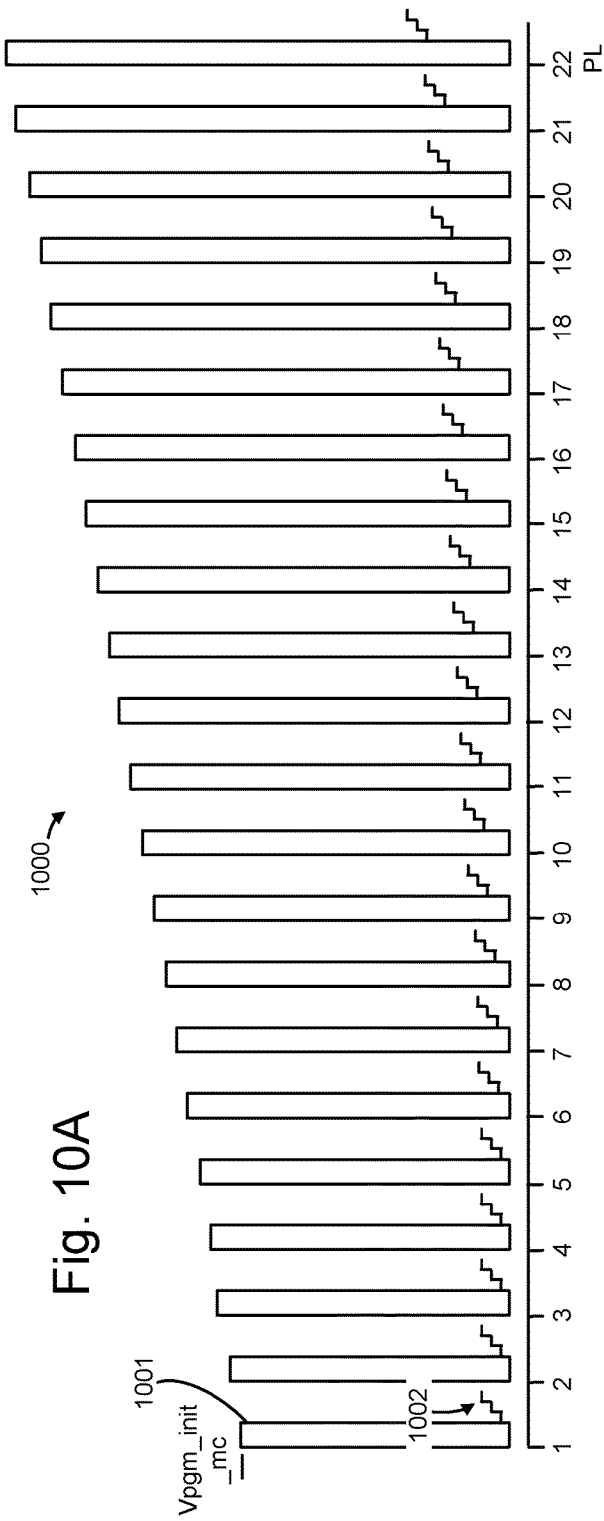
FIG. 10A depicts a voltage signal used in a series of program loops in an example program operation of a memory cell.

During a program operation, the memory cells are programmed according to a word line programming order. For example, the programming may start at the word line at the source-side of the block and proceed to the word line at the drain-side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a series of program loops or program-verify iterations, such as depicted in FIG. 10A. Each program loop includes a program voltage followed by one or more verify voltages. The verify voltages are used in verify tests which determine whether the memory cells have completed programming to an assigned data state. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with an assigned data state according to write data in a program command. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 11A). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sense circuits determine whether cells connected to the word line are in a conductive or non-conductive state. If a cell is in a non-conductive state, the Vth of the memory cell exceeds the read voltage. The read voltages are set at levels which are expected to be between the threshold voltage (Vth) levels of adjacent data states. During the read operation, the voltages of the unselected word lines are ramped up to a read pass level which is high enough to place the unselected memory cells in a strongly conductive state, to avoid interfering with the sensing of the selected memory cells.

To ensure proper program, erase and read operations in a NAND string, the Vth of the SGD transistors should be in a specified range. If the Vth of an SGD transistor is too high, it is difficult to provide the SGD transistor in a conductive state, such as for selected NAND strings in which a memory cell is being programmed, where the SGD transistor should be in a conductive state to allow electrons to enter the channel from the bit line during a program pulse. Equivalently, the SGD transistor should be in a conductive state to allow holes to be discharged from the channel into the bit line. If the SGD transistor is not in a strongly conductive state, this can result in slower programming of the memory cells.

If the Vth of an SGD transistor is too low, it is difficult to provide the SGD transistor in a non-conductive state, such as for an unselected NAND string, where the SGD transistor should be in a non-conductive state to allow the channel to be boosted to prevent program disturb. If the SGD transistor is not in a strongly non-conductive state, this can result in reduced boosting and increase program disturb.

The Vth of the SGD transistors can be set by programming. This can occur before user data is programmed into the memory cells. Optionally, the programming can be repeatedly occasionally during the lifetime of the memory device. In some cases, the Vth can be increased above a level which results with an intrinsic channel layer by doping an associated region of the channel layer. This can occur at the time of manufacture of the memory device. However, the doping concentration is typically non-uniform in the associated region of the channel layer. See also FIGS. 15 and 16. As a result, the Vth of the SGD transistors can differ based on the sensing technique used.

Techniques provided herein address the above and other issues. In one approach, the programming of the SGD transistors is performed under similar biasing as is seen during the programming of a memory cell, when the SGD transistors are required to be in the conductive or non-conductive state for selected and unselected NAND strings, respectively. In one embodiment, a program-verify test for the SGD transistors uses a current (Iwell-bl in FIG. 9) which flows from the source end to the drain end of the NAND string. The program-verify test for a set of SGD transistors can be performed separately for odd- and even-numbered NAND strings, to avoid the effects of bit line-to-bit line coupling which can occur with this type of program-verify test. In contrast, a program-verify test for the memory cells can use a current (Ibl-well in FIG. 9) which flows from the drain end to the source end of the NAND string. The program-verify tests for a set of memory cells can be performed concurrently, in one approach, to reduce the programming time since bit line-to-bit line coupling is not a concern with this type of program-verify test. The increased time for the program-verify test for the SGD transistors is acceptable since this programming occurs occasionally at most during the lifetime of the memory device, while programming of the memory cells occurs more frequently.

Moreover, when the source ends of the NAND strings are in a well region of a substrate, a relatively large amount of power is required to charge up the well region due to its relatively large capacitance, to provide Iwell-bl. Power savings can be achieved by using Iwell-bl for the program-verify test for the SGD transistors but not for the program-verify test for the memory cells. Although, in practice, it is also possible to use Iwell-bl also for the program-verify test for the memory cells.

During the program-verify test of a memory cell, the hole current (Iwell-bl) in the selected NAND string is from the source end to the drain end of the NAND string. As a convention, the direction of the current is the direction of the movement of the holes, from a higher voltage to a lower voltage, and this is opposite the direction of the movement of the electrons, from a lower voltage to a higher voltage. A hole is an electric charge carrier with a positive charge, equal in magnitude but opposite in polarity to the charge on an electron. For the unselected NAND string, a small Iwell-bl may also flow if there is leakage through the SGD transistor, from the channel to the bit line.

These and other features are discussed further below.

Figure 1:
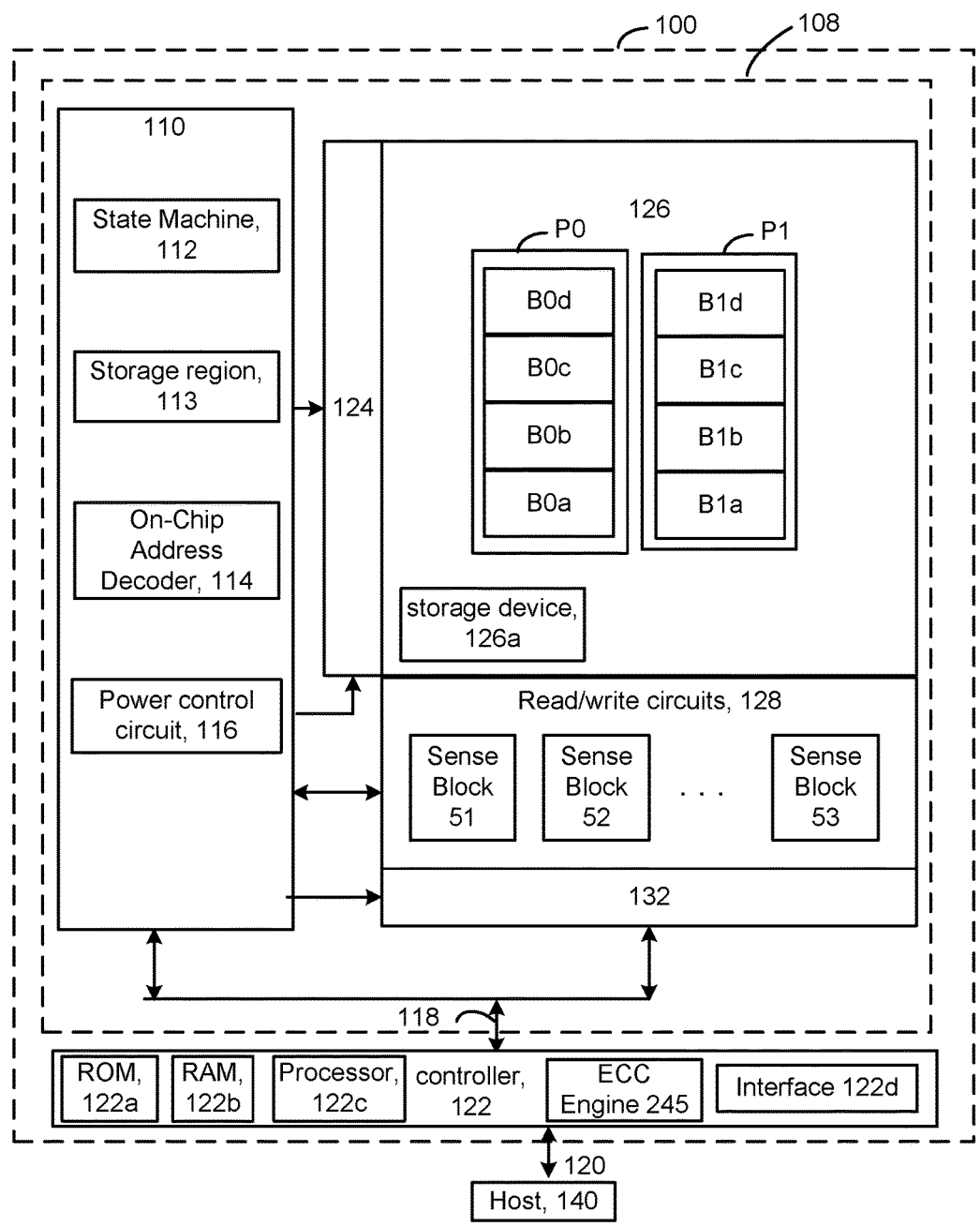
FIG. 1 is a block diagram of an example memory device comprising memory cells arranged in different planes.

FIG. 1 is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control circuit 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 116 controls the power and voltages supplied to the word lines, select gate control lines, bit lines and source lines during memory operations. It can include drivers for data and dummy word lines, SGS and SGD transistors and source lines. See also FIG. 4. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
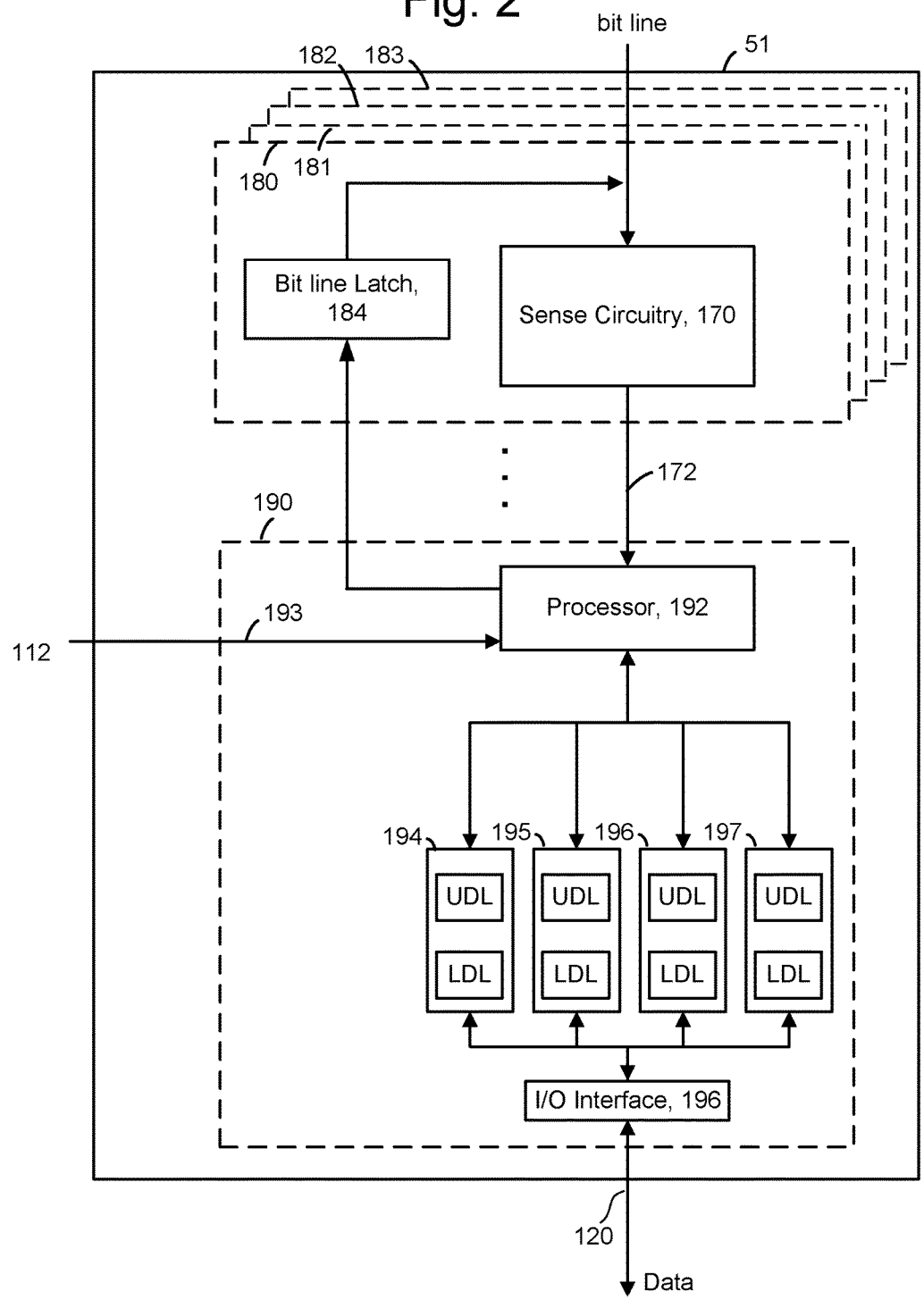
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
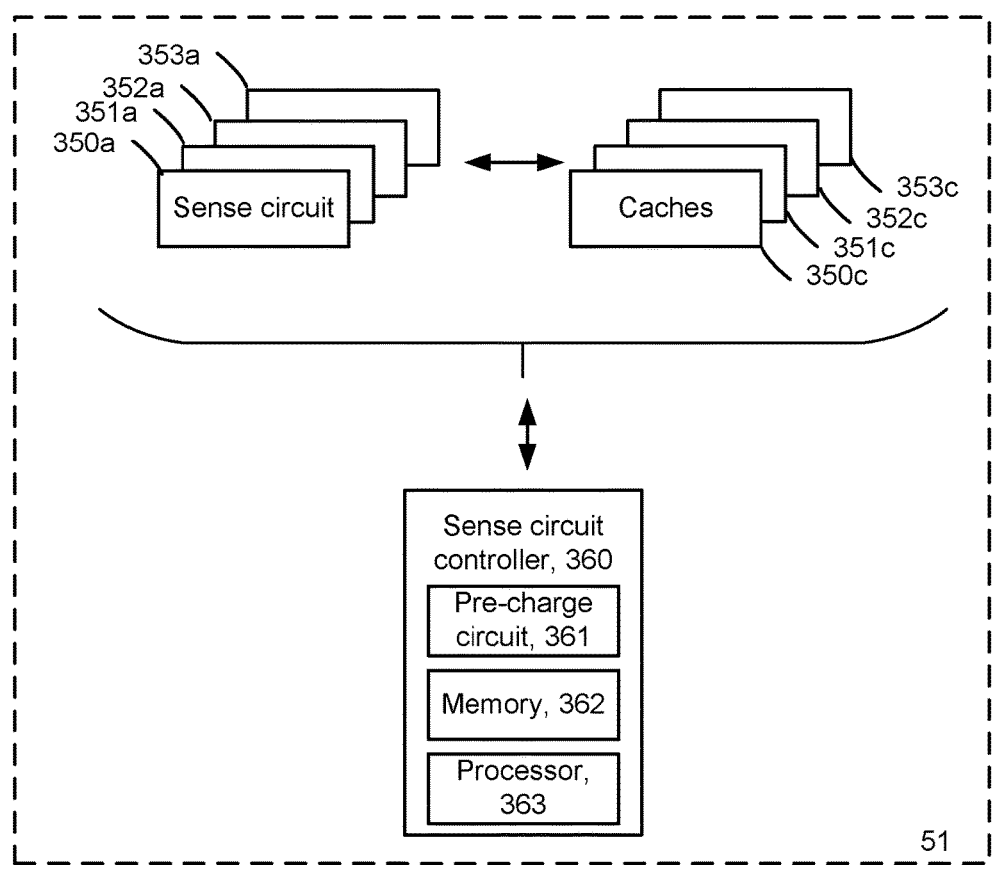
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
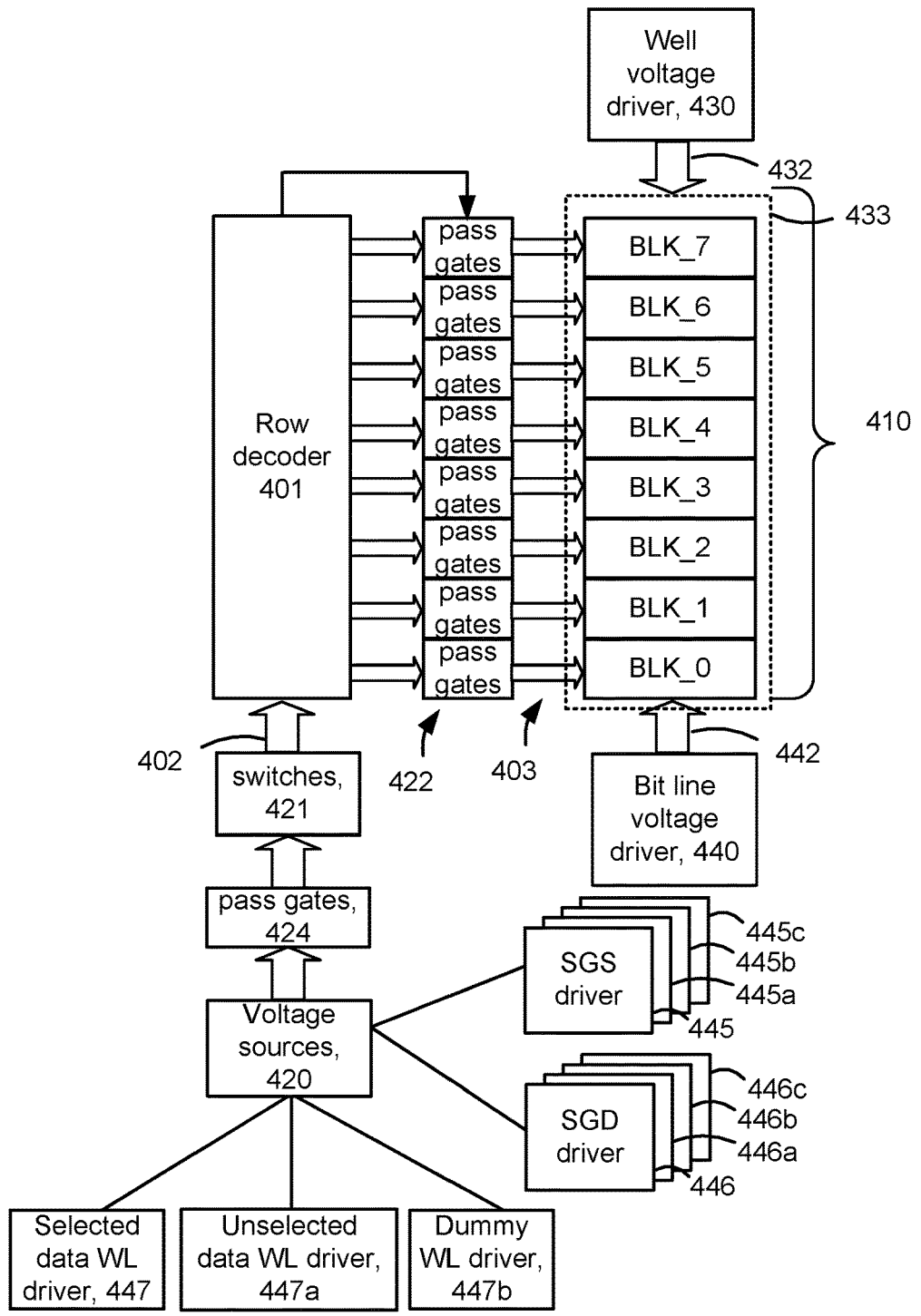
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_7. The row decoder provides a control signal to pass gates 422 which connect the blocks to the row decoder. Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from voltage sources 420. The voltage sources may provide voltages to switches 421 which connect to the global control lines. Pass gates 424, also referred to as pass transistors or transfer transistors, are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447a for unselected data word lines, and a dummy word line driver 447b which provides voltages on dummy word lines.

The voltage sources can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8. In another option, one SGS driver is common to the different sub-blocks in a block.

The various components, including the row decoder, may receive commands from a controller such as the state machine 112 or the controller 122 to perform the functions described herein.

The well voltage driver 430 (or source voltage driver) provides the voltage Vwell to the well region 611a (see FIGS. 6A and 8B) in the substrate, via control lines 432. In one approach, the well region 433 is common to the blocks. A set of bit lines 442 is also shared by the blocks. A bit line voltage source 440 provides voltages to the bit lines. In a stacked memory device such as depicted in FIGS. 5 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 5:
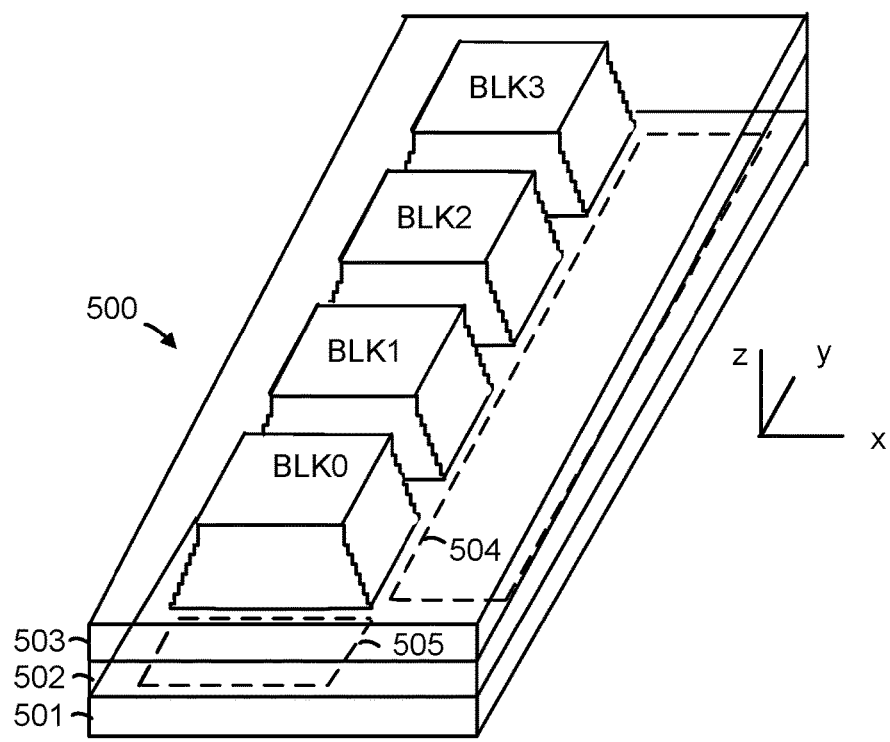
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage driver of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6A:
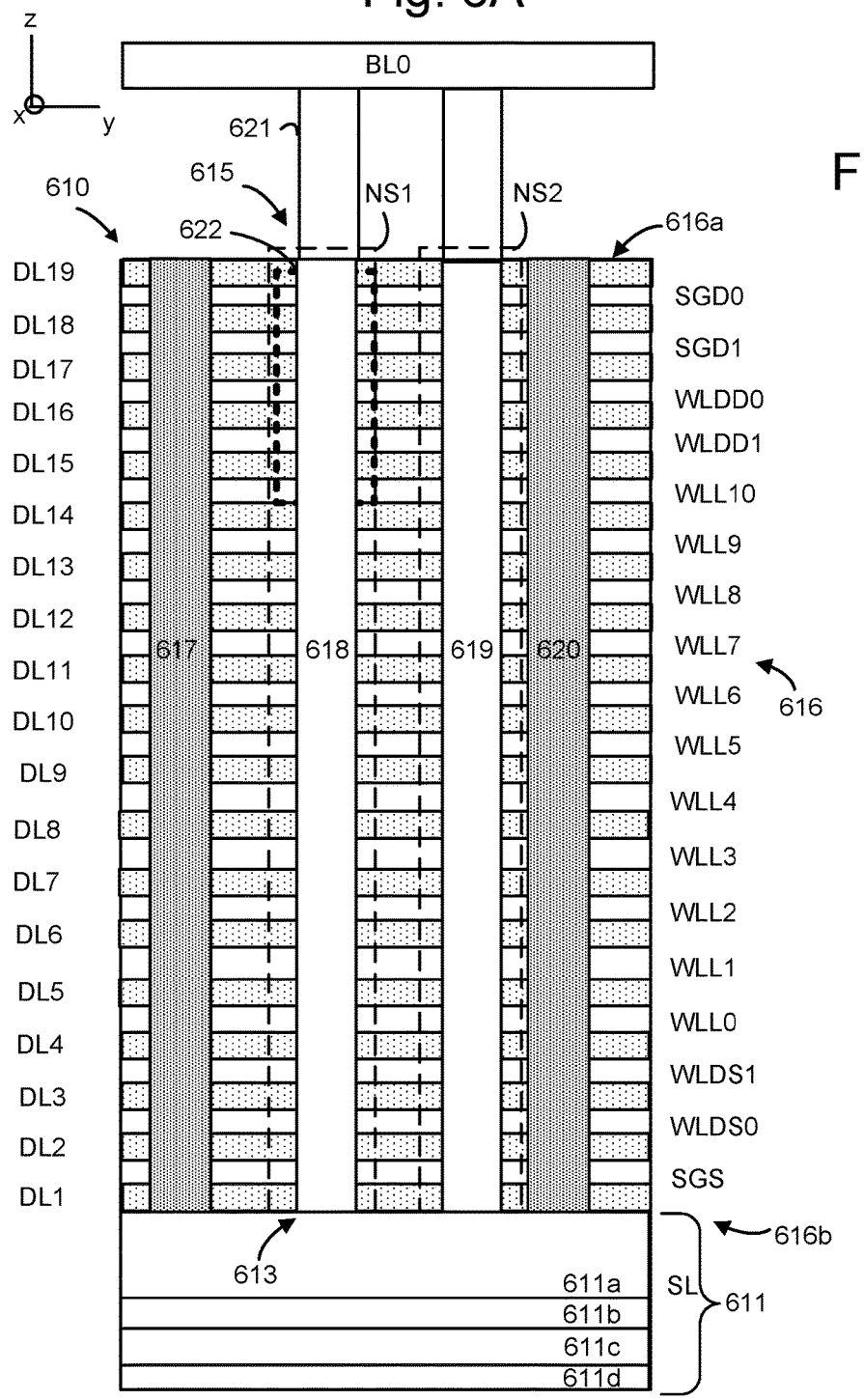
FIG. 6A depicts an example cross-sectional view of a portion of one of the blocks of FIG. 5.

FIG. 6A depicts an example cross-sectional view of a portion of one of the blocks of FIG. 5. The block comprises a stack 610 of alternating conductive and dielectric layers. In this example, the conductive layers comprise two SGD layers, SGD0 and SGD1, one SGS layer, two source-side dummy word line layers (or word lines) WLDS1 and WLDS0, two drain-side dummy word line layers WLDD1 and WLDD0, and eleven data word line layers (or data word lines) WLL0-WLL10. WLL0 is a source-side data word line and WLDS1 is a dummy word line layer which is adjacent to the source-side data word line. WLDS0 is another dummy word line layer which is adjacent to WLDS1. WLL10 is a drain-side data word line and WLDD1 is a dummy word line layer which is adjacent to the drain-side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion region or well region 611a in the substrate which is in contact with a source end or bottom of each string of memory cells in a block. An erase voltage may be applied to this layer in an erase operation The n-type well region 611a is formed in a p-type well region 611b, which in turn is formed in an n-type well region 611c, which in turn is formed in a p-type semiconductor substrate 611d, in one possible implementation. The well region 611a may be shared by all of the blocks in a plane, in one approach. The size and capacitance of the well region is therefore relatively large, as mentioned at the outset, so that setting a positive voltage of the well region during a program-verify test or other sensing operation consumes a relatively large amount of power.

NS1 has a source-end 613 (or bottom end) at a bottom 616b of the stack 616 and a drain-end 615 (or top end) at a top 616*a* of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
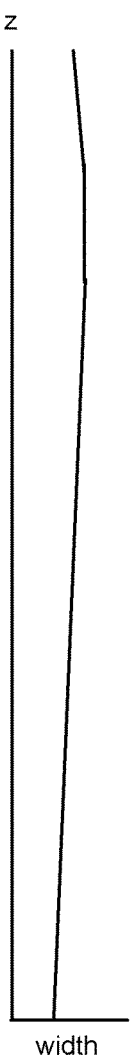
FIG. 6B depicts an example variation in the width of the memory holes of FIG. 6A along their height.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the corresponding width of the vertical pillar which is formed in the memory hole, the programming and erase speed of the memory cells can vary based on their position along the memory hole, e.g., based on their height in the stack. With a smaller diameter memory hole, the electric field across the tunneling layer is stronger, so that the programming and erase speed is higher.

In this case, the memory cells are arranged along vertically-extending memory holes in the memory device, and a width of the vertically-extending memory holes varies along a height of the memory device. Further, this example shows that the memory hole is created by etching through the stack of layers which include word line layers and select gate layers. In one variation, the word line layers are etched through before the SGD layers are deposited and subsequently etched through separately. In another variation, one set of word line layers is deposited and etched through, then another set of word line layers is deposited and etched through. The memory hole diameter can differ from that shown in these different variations.

Figure 6C:
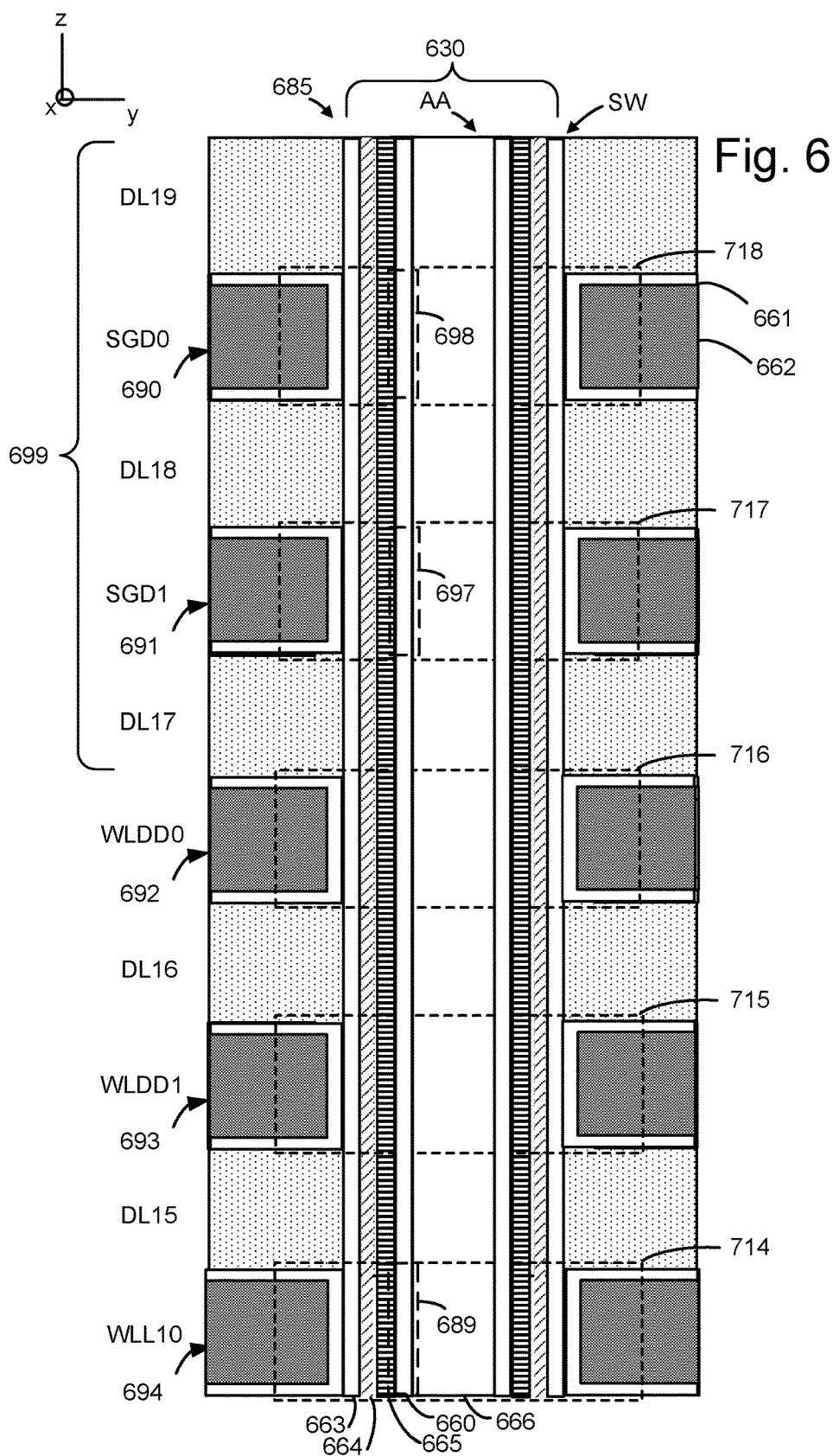
FIG. 6C depicts a close-up view of the region 622 of the stack of FIG. 6A.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

As discussed further below, e.g., in connection with FIG. 15, portions 698 and 697 of the channel layer 660 are included in the SGD transistors 718 and 717, respectively. That is, the portions 698 and 697 span a height of the conductive layers SGD0 and SGD1, respectively. The channel portions of the SGD transistors may be doped, in one approach. However, the doping of the SGD transistor may be non-uniform such that the Vth of this SGD transistor will be different depending on the direction of the current flow during a program-verify test, as mentioned at the outset. In particular, the non-uniformity may be greatest for the topmost SGD transistor 718. The portion 689 of the channel layer in the memory cell is typically undoped. With uniform doping, an assumption is that the Vth of the memory cell will be programmed to the same level regardless of the bias polarity during the program-verify test. However, with non-uniform doping, the Vth of the select gate transitory may be programmed to different levels based on the bias polarity during the program-verify test.

A region 699 of the stack is discussed further in connection with FIG. 15.

Figure 7:
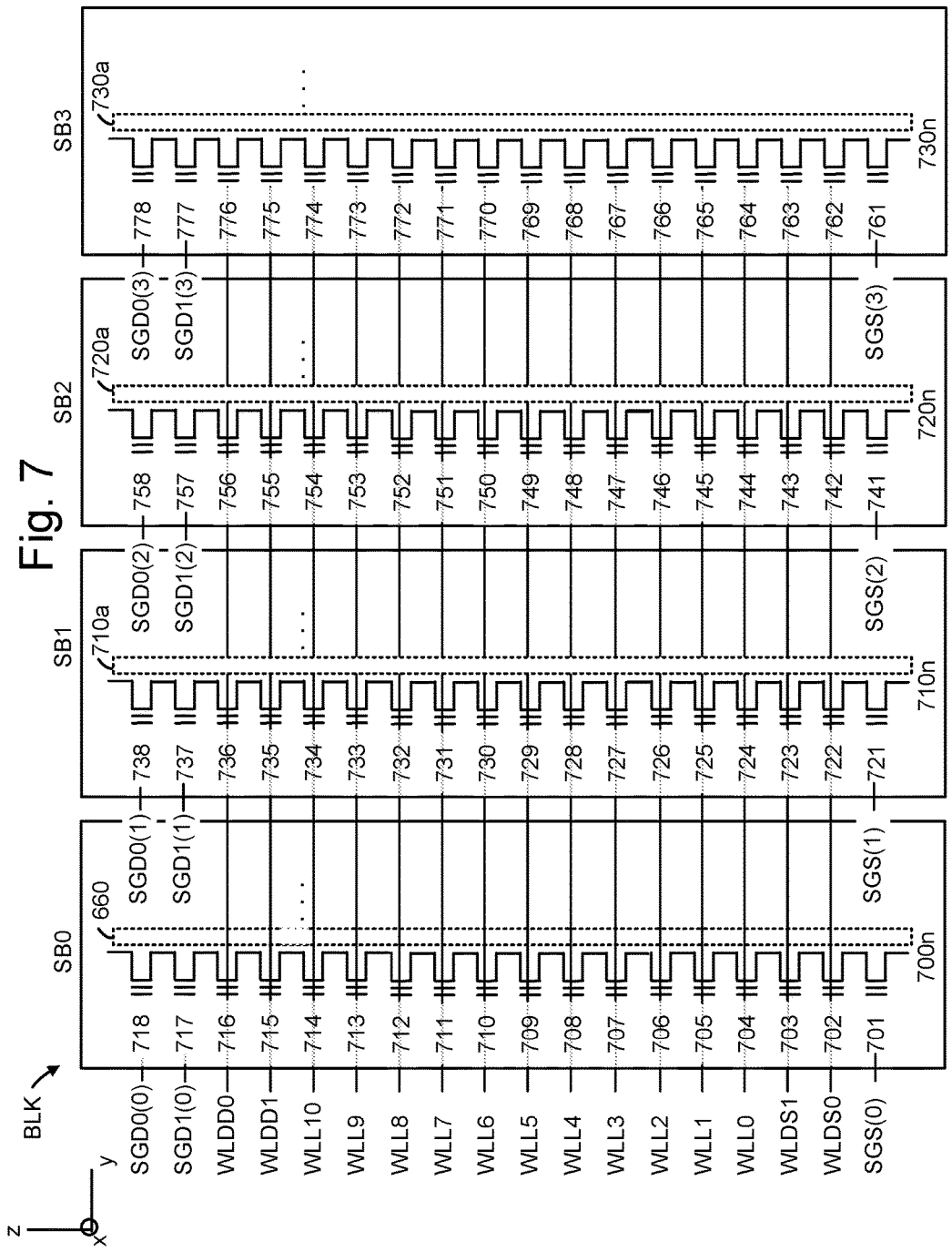
FIG. 7 depicts an example view of NAND strings in sub-blocks in a 3D configuration which is consistent with FIG. 6A.

FIG. 7 depicts an example view of NAND strings in sub-blocks in a 3D configuration which is consistent with FIG. 6A. A NAND string is one example of a set of connected memory cells such as series-connected memory cells. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate control lines consistent with FIG. 6A. Each sub-block comprises a set of NAND strings which extend in the x direction and which have a common SGD line. For simplicity, only one NAND string per sub-block is depicted. Programming of the block may occur based on a word line programming order. Moreover, one option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line, and end at WLL10, the drain-end word line, for example.

The NAND strings 700n, 710n, 720n and 730n have channels 660 (FIG. 6C), 710a, 720a and 730a, respectively.

Additionally, NAND string 700n includes SGS transistor 701, source-side dummy memory cells 702 and 703, data memory cells 704, 705, 706, 707, 708, 709, 710, 711, 712, 713 and 714, drain-side dummy memory cells 715 and 716, and SGD transistors 717 and 718.

The memory cell 714 is an example of an edge data memory cell at the drain end of a NAND string, and the memory cell 704 is an example of an edge data memory cell at the source end of a NAND string.

NAND string 710n includes SGS transistor 721, source-side dummy memory cells 722 and 723, data memory cells 724, 725, 726, 727, 728, 729, 730, 731, 732, 733 and 734, drain-side dummy memory cells 735 and 736, and SGD transistors 737 and 738.

NAND string 720n includes SGS transistor 741, source-side dummy memory cells 742 and 743, data memory cells 744, 745, 746, 747, 748, 749, 750, 751, 752, 753 and 754, drain-side dummy memory cells 755 and 756, and SGD transistors 757 and 758.

NAND string 730n includes SGS transistor 761, source-side dummy memory cells 762 and 763, data memory cells 764, 765, 766, 767, 768, 769, 770, 771, 772, 773 and 774, drain-side dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by control lines SGS(0), SGS(1), SGS(2) and SGS(3), respectively.

Figure 8A:
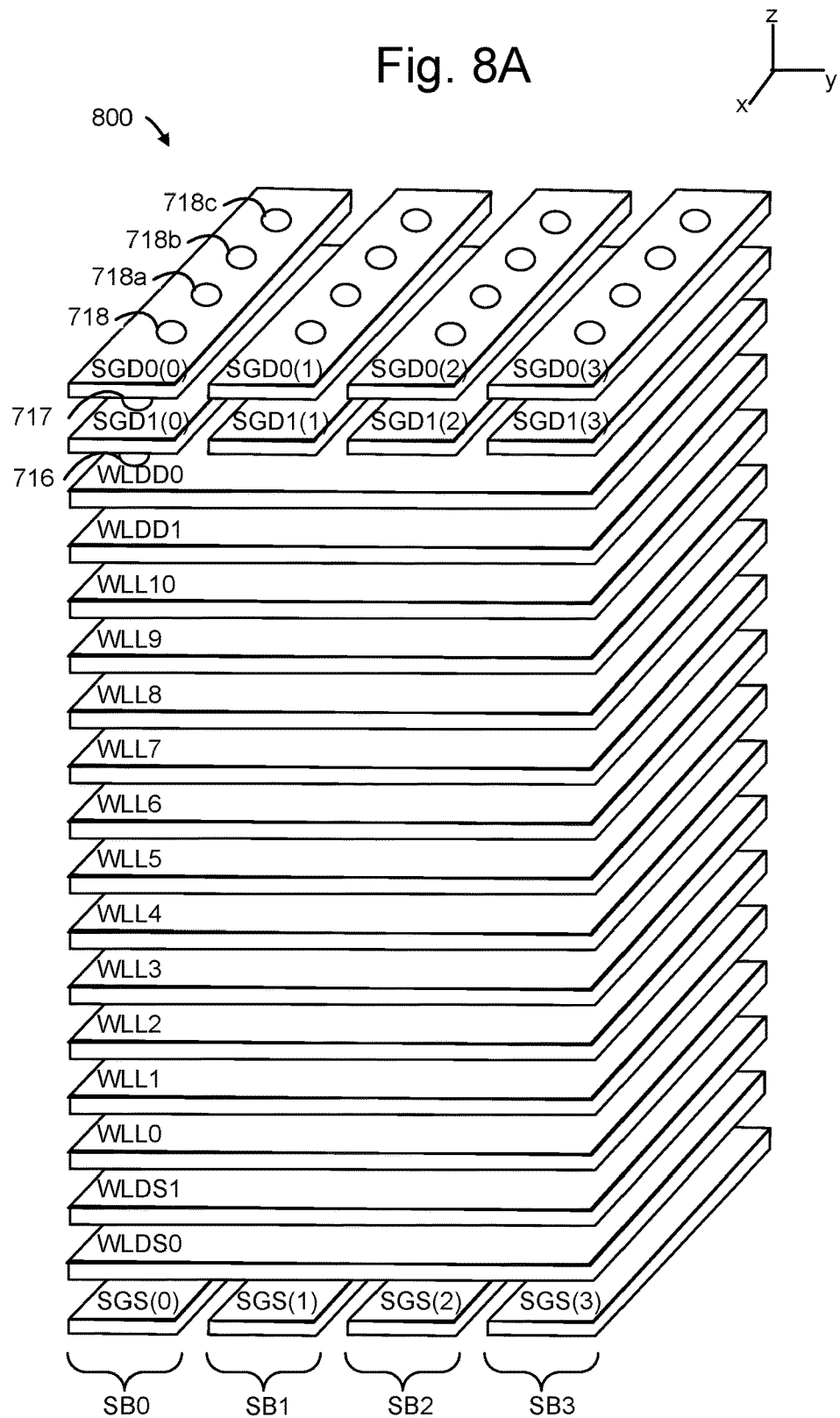
FIG. 8A depicts control gate layers in a stack consistent with FIG. 7.

FIG. 8A depicts control gate layers in a stack 800 consistent with FIG. 7. The control gate layers include dummy word lines layers WLDS0, WLDS1, WLDD0 and WLDD1, and data word line layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

FIG. 8B depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells 801, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 734, is connected to WLL10 in SB1.

In this example, the source line SL or source region is driven at a voltage Vwell by the well voltage driver 430.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven. For example, SB0 has sets of SGD transistors 840 and 839, with example SGD transistors 718 and 717, respectively, in the NAND string 700n. The set of SGD transistors 840 also includes an example SGD transistor 719 in the NAND string 701n. SB0 also has a set of SGS transistors 843, with an example SGS transistor 701 in the NAND string 700n. Similarly, SB1 has sets of SGD transistors 860 and 849, with example SGD transistors 738 and 737, respectively, in the NAND string 710n. SB1 also has a set of SGS transistors 853, with an example SGS transistor 721 in the NAND string 710n.

The NAND string 700n includes SGD transistors 718 and 717 connected to select gate control lines SGD0(0) and SGD1(0), respectively, dummy memory cells 716 and 715 connected to WLDD0 and WLDD1, respectively, and data memory cells 714 and 713 connected to WLL10 and WLL9, respectively. The NAND string 710n includes SGD transistors 738 and 737 connected to select gate control lines SGD0(1) and SGD1(1) (see FIG. 7), respectively, dummy memory cells 736 and 735 connected to WLDD0 and WLDD1, respectively, and data memory cells 734 and 733 connected to WLL10 and WLL9, respectively.

Figure 9:
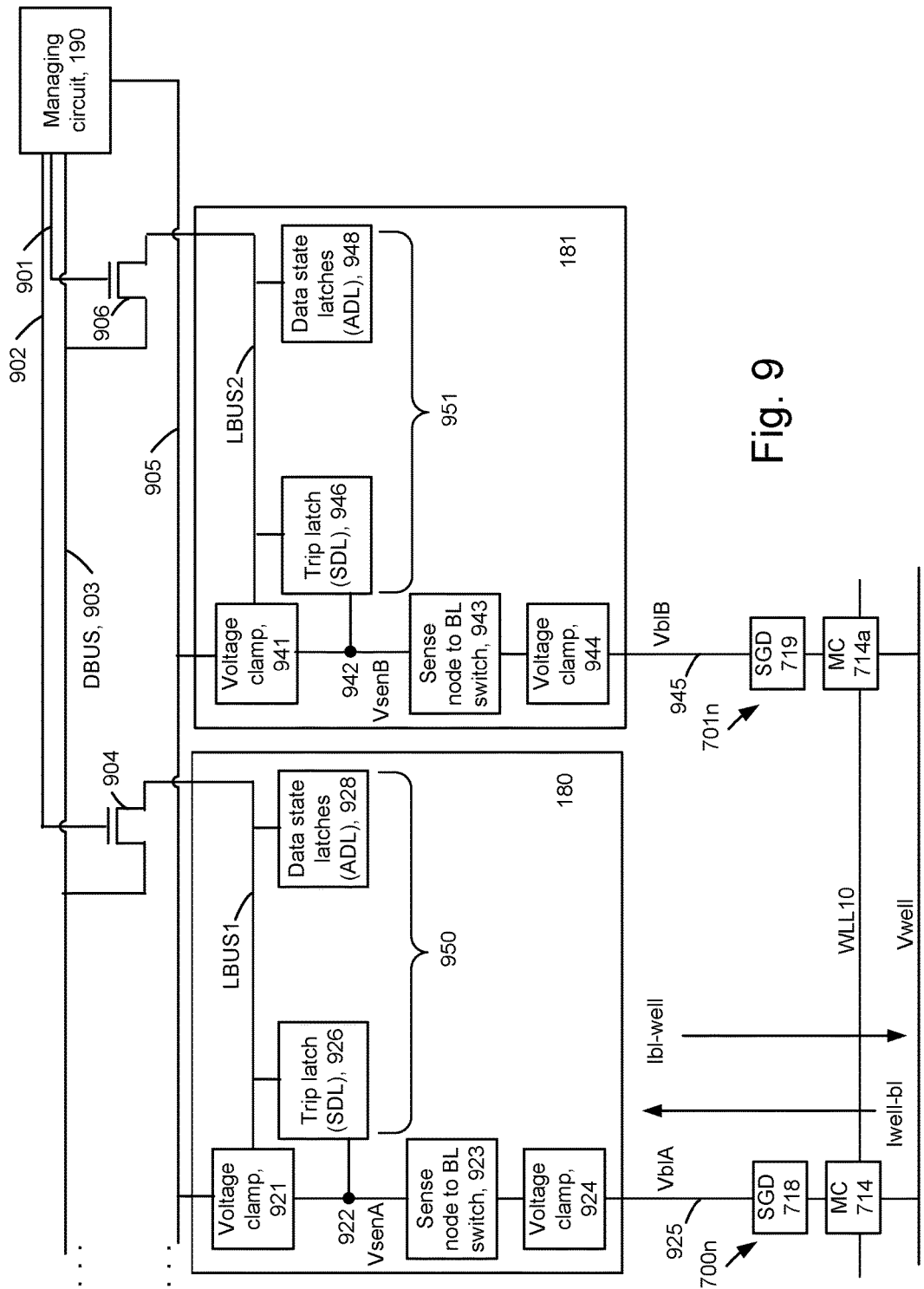
FIG. 9 depicts example block diagrams of the sense circuits 180 and 181 of FIGS. 2 and 8B.

FIG. 9 depicts example block diagrams of the sense circuits 180 and 181 of FIGS. 2 and 8B. The managing circuit 190 communicates with multiple sense circuits including example sense circuits 180 and 181. The sense circuit 180 includes latches 950, including a trip latch 926 (SDL), and data state latches 928 (ADL). The sense circuit further includes a voltage clamp 921 such as a transistor which sets a voltage VsenA at a sense node 922 (SEN) during a program-verify test or other sensing operation. A sense node-to-bit line (BL) switch 923 selectively allows the sense node to communicate with a bit line 925, e.g., the sense node is electrically connected to the bit line. The bit line 925 has a voltage VblA and is connected to the NAND string 700n. For simplicity, the SGD transistor 718 and memory cell 714 are depicted as a representative select gate transistor and memory cell, respectively, consistent with FIGS. 7 and 8B. A voltage clamp 924 can set a voltage on the bit line, such as during a sensing operation or during a program voltage. A local bus, LBUS1, allows the sense circuit controller to communicate with components in the sense circuit, such as the latches 950 and the voltage clamp in some cases. To communicate with the sense circuit 180, the sense circuit controller provides a voltage via a line 902 to a transistor 904 to connect LBUS1 with a data bus DBUS, 903. The communicating can include sending data to the sense circuit and/or receiving data from the sense circuit.

The sense circuit controller can communicate with different sense circuits in a time-multiplexed manner, for instance. A line 905 may be connected to the voltage clamp in each sense circuit, in one approach.

Similarly, the sense circuit 181 includes latches 951, including a trip latch 946 (SDL) and data state latches 948 (ADL). A voltage clamp 941 may be used to set a voltage VsenB at a sense node 942 (SEN). A sense node-to-bit line (BL) switch 943 selectively allows the sense node to communicate with a bit line 945, and a voltage clamp 944 can set a voltage on the bit line. The bit line 945 is connected to one or more memory cells such as a memory cell MC2.

The bit line 945 has a voltage VblB and is connected to the NAND string 701n. For simplicity, the SGD transistor 719 and memory cell 714a are depicted, consistent with FIGS. 7 and 8B. A local bus, LBUS2, allows the sense circuit controller to communicate with components in the sense circuit, such as the latches 951 and the voltage clamp in some cases. To communicate with the sense circuit 181, the sense circuit controller provides a voltage via a line 901 to a transistor 906 to connect LBUS2 with DBUS. The lines 901 and 902 can be considered to be sense amplifier control lines.

The example memory cells 714 and 714a are connected to a selected word line WLL10.

A cache may be associated with each sense circuit and connected to DBUS.

FIG. 10A depicts a voltage signal used in a series of program loops in an example program operation of a memory cell. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1000 includes a series of program voltages, including an initial program voltage 1001, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int_mc (see program voltage 1001) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1002, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. More detailed examples of the verify signals are provided in FIG. 13A.

All memory cells may initially be in the erased state at the beginning of the program operation, for instance. After the program operation is completed, a Vth distribution similar to that in FIG. 11A ideally is achieved, and the data can be read from the memory cells using read voltages which are between the Vth distributions. At the same time, a read pass voltage, Vread pass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. See also FIG. 11A. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 10B:
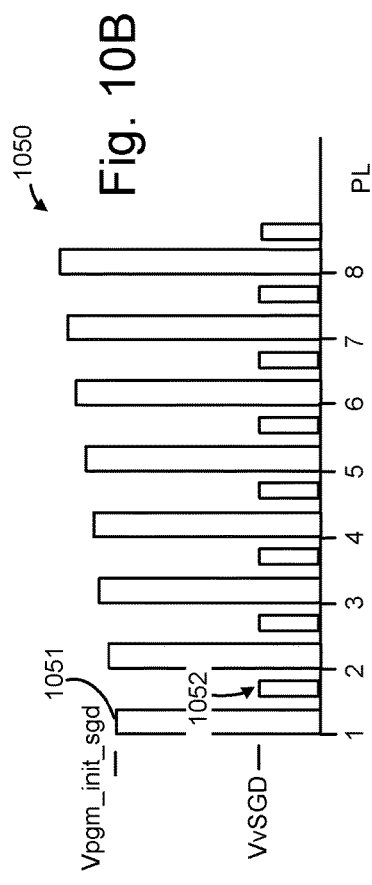
FIG. 10B depicts a voltage signal used in a series of program loops in an example program operation of a select gate transistor.

FIG. 10B depicts a voltage signal used in a series of program loops in an example program operation of a select gate transistor. The horizontal axis denotes a program loop number, ranging from 1-8, and the vertical axis denotes voltage. The programming of the select gate transistors is similar to the programming of the memory cells except typically a smaller initial program voltage, Vpgm_init_sgd, is used and the operation may be completed in fewer program loops. The voltage signal 1050 includes a series of program voltages, including an initial program voltage 1051, which are applied to a select gate control line which is selected for programming. The verify signal in each program loop, including example verify signal 1052, includes a verify voltage VvSGD. Note that, in some cases, there are multiple SGD transistors in a NAND string. In this case, the SGD transistors can be programmed separately. Moreover, a different verify voltage can be used in the programming of the different SGD transistors of the NAND string. In some cases, the topmost SGD transistor is programmed to the highest Vth among the SGD transistors in a NAND string. This allows for a gradual reduction in the channel voltage under the SGD transistors to avoid gradients which can induce disturbs.

The step size can be different for the programming of the select gate transistors compared to the programming of the memory cells.

The step size and initial program voltage can also be different for the programming of the topmost select gate transistor compared to the programming of another select gate transistor in the same NAND string. Also, the different select gate transistors in a NAND string can have different initial threshold voltages at the time of manufacture due to the presence of dopants in the channel layer of the topmost select gate transistor but not in the channel layer of the other select gate transistors.

Figure 11A:
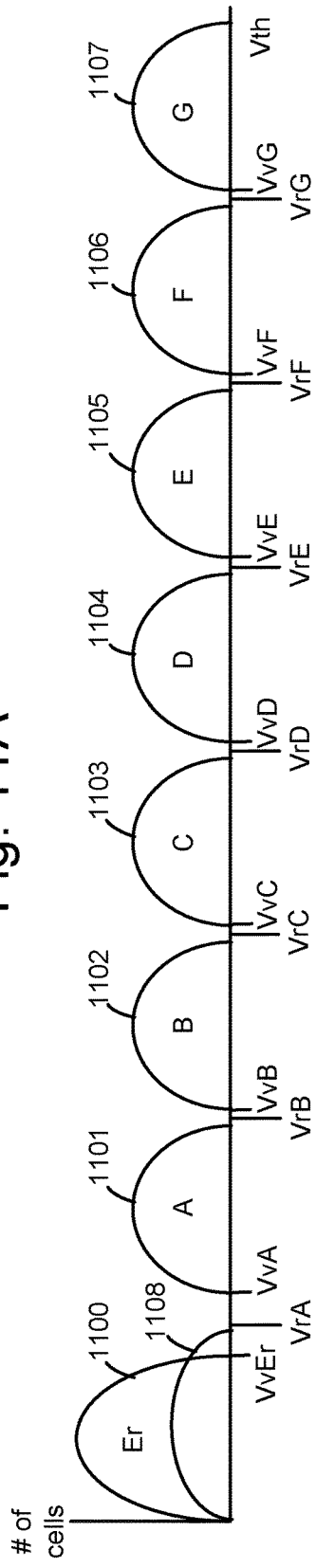
FIG. 11A depicts an example Vth distribution of a set of memory cells after a program operation.

FIG. 11A depicts an example Vth distribution of a set of memory cells after a program operation. The vertical axis depicts a number of memory cells, on a logarithmic scale, and the horizontal axis depicts a Vth of the memory cells on a linear scale. Eight data states are used, as an example. In one approach, at a start of the program operation, the memory cells are all initially in the erased state as represented by the Vth distribution 1100. After the program operation is successfully completed, the memory cells assigned to the Er state are represented by the Vth distribution 1108. The Vth distribution is upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1101, 1102, 1103, 1104, 1105, 1106 and 1107, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

Figure 11B:
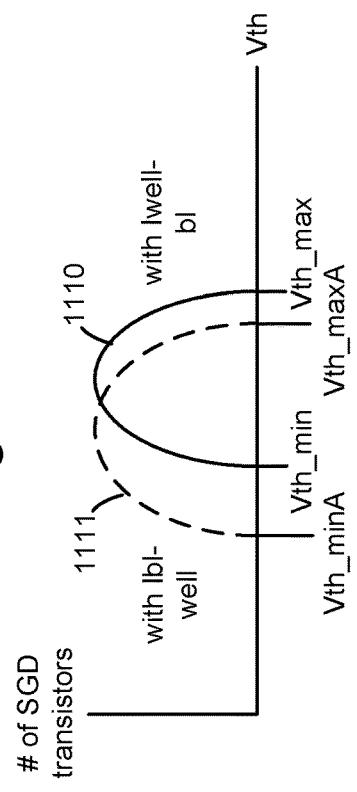
FIG. 11B depicts an example Vth distribution 1111 for a set of select gate transistors after a program operation in which a program-verify test uses a bit line to well current, and an example Vth distribution 1110 when the set of select gate transistors are biased using a well to bit line current.

FIG. 11B depicts an example Vth distribution 1111 for a set of select gate transistors after a program operation in which a program-verify test uses a bit line to well current (Ibl-well), and an example Vth distribution 1110 when the set of select gate transistors are biased using a well to bit line current (Iwell-bl). The Vth distribution 1111 extends from a bottom voltage Vth_min_A to a top voltage Vth_max_A, and the Vth distribution 1110 extends from a bottom voltage Vth_min to a top voltage Vth_max. As mentioned, due to non-uniform doping of the channel layer of a select gate transistor, mixing of p-type and n-type dopants in a portion of the channel layer, in addition to other factors, the Vth to which the transistor is programmed can vary depending on the biasing during the program-verify test. See also FIG. 16. A biasing with a well voltage which is higher than a bit line voltage results in Iwell-bl and can lead to one Vth distribution, while a biasing with a well voltage which is lower than a bit line voltage results in Ibl-well and can lead to another Vth distribution. This result holds even assuming that other sensing parameters are the same, including the verify voltage on the control gate, the trip voltage and the sense time.

The Vth distributions 1110 and 1111 are just one example of different Vth distributions which are obtained with different sensing polarities in program-verify tests.

In practice, the Vth of the SGD transistors can vary based on the polarity of the bias during the program-verify test due to different factors including non-uniformities in the fabrication process and non-uniform doping. For example, the Vth with Ibl-well can be higher than the Vth with Iwell-bl. In another approach, the Vth with Ibl-well can be wider or narrower than the Vth with Iwell-bl. The techniques provided herein automatically account for these factors by performing the program-verify test for the SGD transistors using the same biasing or current direction which is experienced by the SGD transistors during the programming of the memory cells, e.g., during the program voltage. During the program voltage, a bias is higher on the bottom side of the conductive SGD transistor (the side which faces the well region of the substrate) than on the top side (which faces the bit line). This applies to both selected and unselected NAND strings.

For proper operation of the memory device, the control gate voltage of the SGD transistors in a selected sub-block should be within a narrow operational window such as about 1 V. Maximizing this window during programming is important to increase program reliability for NAND memory. Specifically, for a selected NAND string in which memory cells are being programmed, a low bit line bias such as 0 V is provided during the program pulse. If the SGD bias is too low, the channel potential will increase when the selected and unselected word line voltages ramp up at the beginning of a program loop. Therefore, the SGD bias should be high enough to turn on (make conductive) all of the SGD transistors (with 0 V on their source side) in the selected NAND strings, and the associated "on" current should be high enough to fully discharge the associated channels. This is expressed by: Vsgd>Vth_max+ΔVon, where Vth_max is the maximum Vth of the SGD transistors, where it is most difficult to turn on the SGD transistor, and ΔVon is the extra control gate bias needed to supply a sufficiently high on-current. Note that for this SGD Vth, the source side of the SGD transistor is the top side, which faces the BL side, and the drain side is the bottom side, which faces the memory cells and the substrate.

Vsgd should therefore satisfy: Vth_max+ΔVon<Vsgd<Vbl_sel+Vth_min−ΔVoff, where Vbl_sel is the inhibit voltage of the bit line for the select NAND string, and ΔVoff is the extra control gate bias needed to sufficiently turn off the SGD transistor. The Vsgd window, or range of acceptable voltages, is: Vsgd window=Vbl_sel+Vth_min−ΔVoff−Vth_max−ΔVon, or Vsgd window=Vbl_sel−(Vth_max−Vth_min)−(ΔVon+ΔVoff). Vth_max−Vth_min is the width of the Vth distribution. If this width is smaller, the Vsgd margin will be larger. Accordingly, it is desirable to accurately program the SGD transistors to achieve a narrow Vth distribution width and an optimal Vth level.

During programming of the SGD transistors, the Vth of the SGD transistors is verified after each program pulse using a program-verify test. If a higher bias is used on the bit line compared to the drain end of the NAND string, in the well region of the substrate, the Vth is measured under a "drain on BL side/source on well side" configuration. However, as explained previously, to maximize Vsgd margin, what really matters is the Vth distribution width under the opposite polarity ("source on BL side/drain on well side"). If the SGD transistor is non-uniform, such as in terms of its channel doping concentration, the Vth of the SGD transistors can differ when measured under the two opposite polarities. In other words, the program-verify test for the SGD transistors should be performed under the optimal biasing even when this is different than the biasing using in the program-verify test for the memory cells.

To program the SGD transistors to a narrow Vth distribution in a more effective way which can increase Vsgd margin, it is proposed that during a program-verify test for the SGD transistors, a relatively low bias (a source bias) is applied on the bit lines, while a relatively high bias (a drain bias) is applied on the well region. This bias polarity may be opposite to that used during sensing operations including program-verify tests and read operations for memory cells.

Figure 12A:
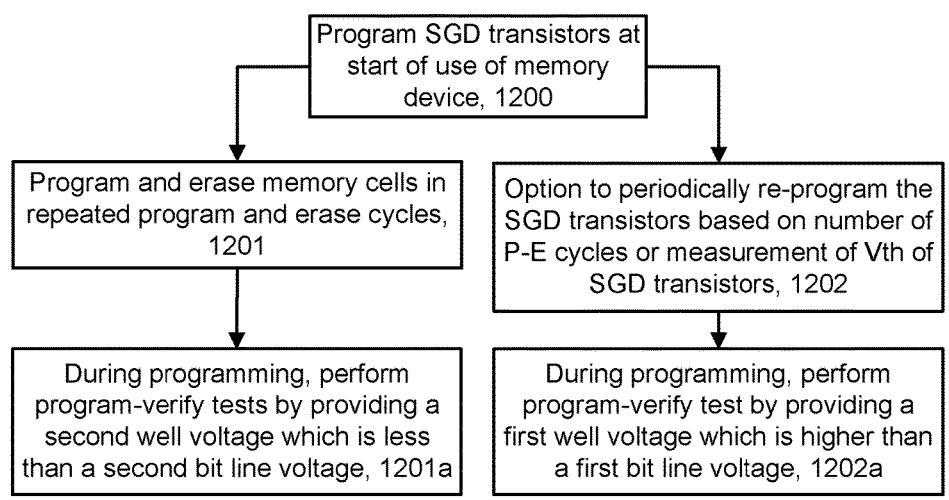
FIG. 12A depicts a flowchart of an example process for programming memory cells and select gate transistors.

FIG. 12A depicts a flowchart of an example process for programming memory cells and select gate transistors. Step 1200 includes programming the SGD transistors at the start of use of the memory device. For example, this could occur at the time of manufacture and testing of the memory device, or at a time of an initial use of the memory device when it is in the hands of the end user. Step 1201 indicates that programming and erasing of the memory cells occurs in repeated program and erase (P-E) cycles based on the use of the memory device. Step 1201a indicates that during the programming of step 1201, program-verify tests are performed by providing a second well voltage which is less than a second bit line voltage. This results in a current Ibl-well. The program-verify tests can be performed concurrently for all NAND strings, in one approach, since this biasing does not cause bit line coupling which could interfere with the sensing process, in some cases.

Step 1202 includes the option to periodically re-program the SGD transistors based on the number of P-E cycles or based on a measurement of the Vth of the SGD transistors. The measurement can involve sensing the SGD transistors to determine whether a specified portion of them have a Vth below a lower demarcation level, e.g., at least 1-5%. The Vth of the SGD transistors can downshift over time to due various factors including hole injection. An example of a lower demarcation level in FIG. 11B is Vth_minA or Vth_min, where the sensing uses Iwell-bl or Ibl-well, respectively. It is advantageous to sense the SGD transistors using Iwell-bl to determine if a re-programming is indicated for the same reasons as described herein as to why it is advantageous to sense the SGD transistors using Iwell-bl during program-verify tests for the SGD transistors. If such a downshift has occurred, the SGD transistors can be subject to a program operation. The measurement can also involve sensing the SGD transistors to determine whether a specified portion of them have a Vth above an upper demarcation level. The Vth of the SGD transistors can upshift over time to due various factors including disturbs. If such an upshift has occurred, the SGD transistors can be subject to an erase and then a program operation.

Step 1202a indicates that during the programming of step 1202, the program-verify tests are performed by providing a first well voltage which is higher than a first bit line voltage. This results in a current Iwell-bl. The first well voltage may also be higher than the second well voltage of step 1201a. The program-verify tests can be performed for odd-numbered NAND strings separately from even-numbered NAND strings, in one approach, since this biasing may cause bit line coupling which could interfere with the sensing process. See also FIG. 14D, which shows an example of a coupled up bit line voltage for an unselected bit line.

In one approach, the programming of the select gate transistor occurs before user data is stored in a block, and the programming of the memory cell involves programming user data into the memory cell.

In FIG. 12A to 12E, the steps are not necessarily performed as separate steps, and some steps may overlap in time.

Figure 12B:
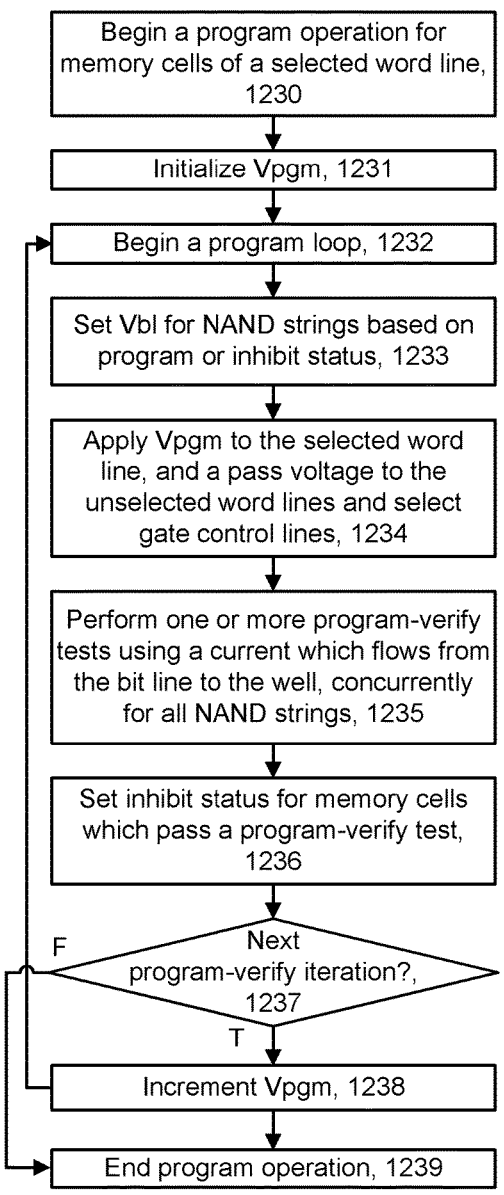
FIG. 12B depicts a flowchart of an example process for programming memory cells, consistent with FIG. 12A.

FIG. 12B depicts a flowchart of an example process for programming memory cells, consistent with FIG. 12A. At step 1230, a program operation begins for memory cells of a selected word line. In one approach, the programming involves memory cells in one sub-block of a block. Step 1231 initializes a program voltage, Vpgm to Vpgm_init_mc (FIG. 10A). Step 1232 begins a program loop of the program operation. Step 1233 sets the bit line voltage Vbl for the NAND strings based on a program or inhibit status. In the initial program loop, the program or inhibit status is based on write data. For example, Vbl may be 0 V for a NAND string with a program status and 1.5-3 V for a NAND string with an inhibit status. Step 1234 applies a program voltage Vpgm (program pulse), e.g., 15-25 V, to the selected word line and a pass voltage, e.g., 8-10 V, to the unselected word lines, which may include both data and dummy word lines. The pass voltage is high enough to provide the memory cells connected to the unselected word lines in a conductive state.

Step 1235 performs one or more program-verify tests using a current which flows from the bit line to the well (Ibl-well). Further, the program-verify tests can be performed concurrently for all of the NAND strings which are being programmed, in one approach, including adjacent NAND strings. During the program-verify test, a verify voltage is applied to the selected word line, and pass voltages are applied to the unselected word lines and to the select gate control lines. The pass voltages are high enough to provide the memory cells connected to the unselected word lines, and the select gate transistors connected to the select gate control lines, in a conductive state. For a program operation in which there are eight data states, the verify voltage may be one or more of VvA-VvG in FIG. 11A.

Step 1236 sets an inhibit status for the memory cells which pass a program-verify test. Other memory cells may continue to have a program status. A decision step 1237 determines whether there is a next program-verify iteration in the program operation. This is false if all or nearly all of the selected memory cells have pass their program-verify test, in which case the program operation ends (step 1239). If decision step 1237 is true, step 1238 increments Vpgm and step 1232 begins the next program loop.

Figure 12C:
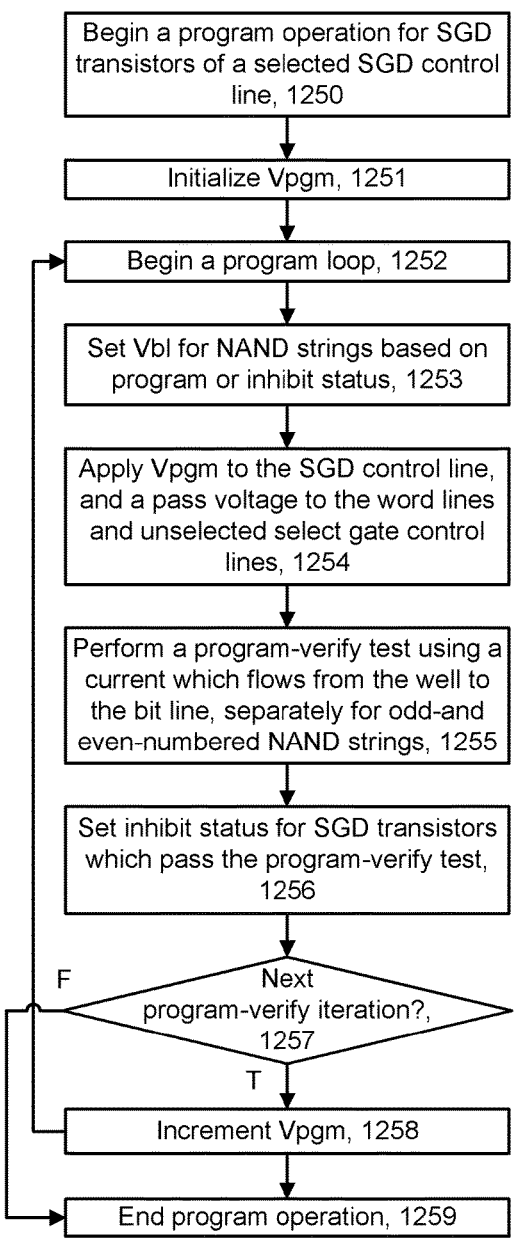
FIG. 12C depicts a flowchart of an example process for programming select gate transistors, consistent with FIG. 12A.

FIG. 12C depicts a flowchart of an example process for programming select gate transistors, consistent with FIG. 12A. At step 1250, a program operation begins for SGD transistors of a selected SGD control line. In one approach, the programming involves memory cells in one sub-block of a block. Step 1251 initializes a program voltage, Vpgm to Vpgm_init_sgd (FIG. 10B). Step 1252 begins a program loop of the program operation. Step 1253 sets the bit line voltage Vbl for the NAND strings based on a program or inhibit status. In an initial programming, a program status will be set for all of the NAND strings since all of the SGD transistors will have a Vth below the verify level, in one approach. However, for a re-programming, it may be that only a subset of the SGD transistors are to be programmed (e.g., the SGD transistors to be re-programmed are those identified as having a Vth below a lower demarcation level) and these will have a program status while other SGD transistors will have an inhibit status.

For example, Vbl may be 0 V for a NAND string with a program status and 1.5-3 V for a NAND string with an inhibit status. Step 1254 applies a program voltage Vpgm (program pulse), e.g., 10-15 V, to the SGD control line and a pass voltage, e.g., 8-10 V, to the unselected word lines. A lower pass voltage (Vsg_pass) such as 6-8 V may be applied to other select gate transistors including SGD and SGS transistors. The higher pass voltage is high enough to provide the memory cells connected to the unselected word lines in a conductive state, and the lower pass voltage is high enough to provide the unselected select gate transistors connected to the unselected select gate control lines in a conductive state.

Step 1255 performs one or more program-verify tests using a current which flows from the well to the bit line (Iwell-bl). Further, the program-verify tests can be performed separately for the odd- and even-numbered NAND strings. For example, the program-verify tests can be performed concurrently for the odd-numbered NAND strings, e.g., those connected to bit lines BL1, BL3, . . . , and subsequently the program-verify tests can be performed concurrently for the even-numbered NAND strings, e.g., those connected to bit lines BL0, BL2, . . . .

During the program-verify test, a verify voltage VvSGD (see FIG. 10B) is applied to the selected SGD control line, and pass voltages are applied to the word lines and unselected select gate control lines.

Step 1256 sets an inhibit status for the SGD transistors which pass the program-verify test. Other SGD transistors may continue to have a program status. A decision step 1257 determines whether there is a next program-verify iteration in the program operation. This is false if all or nearly all of the selected SGD transistors have passed the program-verify test, in which case the program operation ends (step 1259). If decision step 1257 is true, step 1258 increments Vpgm and step 1252 begins the next program loop.

Figure 12D:
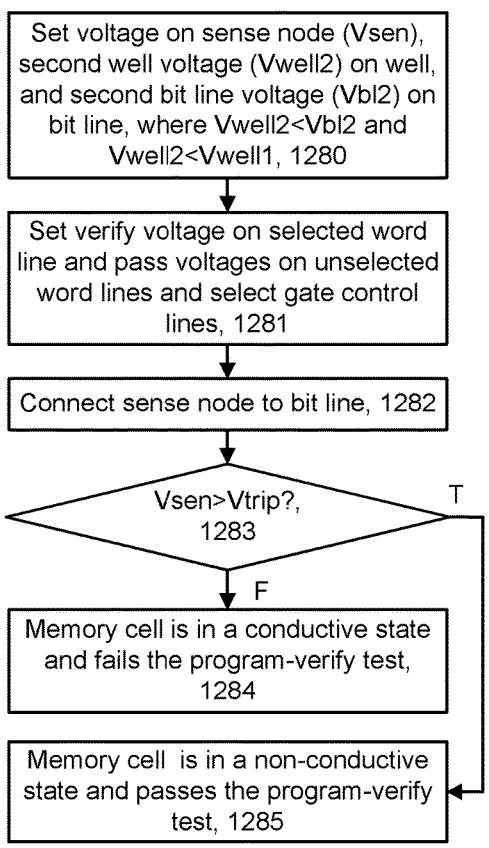
FIG. 12D depicts a flowchart of an example process for performing a program-verify test for a memory cell, consistent with step 1235 of FIG. 12B.

FIG. 12D depicts a flowchart of an example process for performing a program-verify test for a memory cell, consistent with step 1235 of FIG. 12B. This process biases the memory cell so that an Ibl-well current flows when the memory cell is in a conductive state. Step 1280 sets a voltage on a sense node (Vsen) (see also FIG. 9), a second well voltage (Vwell2) on a well region of the substrate, and a second bit line voltage (Vbl2) on a bit line of the selected NAND string, where Vwell2<Vbl2 and Vwell2<Vwell1. Since the bit line is at a higher bias than the well region, a current will flow from the bit line to the well region when the memory cell is in a conductive state. Step 1281 sets a verify voltage on the selected word line and pass voltages on the unselected word lines and the select gate control lines. Step 1282 connects the sense node to the bit line, such as by turning on the switches 923 and 943 in FIG. 9. At this time, the sense node can decay into the bit line if the memory cell is in a conductive state.

A decision step 1283 determines if Vsen>Vtrip, where Vtrip is a respective trip voltage or demarcation voltage. If the decision step is false, the memory cell is in a conductive state and fails the program-verify test (step 1284). In this case, Vsen<=Vtrip since there is a significant decay in the sense node. If the decision step is true, the memory cell is in a non-conductive state and passes the program-verify test (step 1285). In this case, there is not a significant decay in the sense node. See also FIG. 13A to 13E. Vsen can be used to judge the amount of current To perform the program-verify test for the memory cell, the sense circuit is configured to connect a sense node of the sense circuit to the bit line while judging an amount of current which flows from the bit line to the well region based on a voltage of the sense node, wherein the sense circuit determines that the memory cell is in a conductive state when the voltage of the sense node is below a respective trip voltage. The amount of current is greater when the voltage of the sense node is lower.

This program-verify test can use current sensing, which involves sensing a voltage drop which is tied to a fixed current. A capacitor connected to the sense node can be used to set Vsen. The decrease in Vsen is then tied to a fixed current flow by the relationship $\Delta V = i \cdot t / C$, where $\Delta V$ is the voltage drop, i is the fixed current, t is a predetermined discharge time period and C is the capacitance of the capacitor.

Figure 12E:
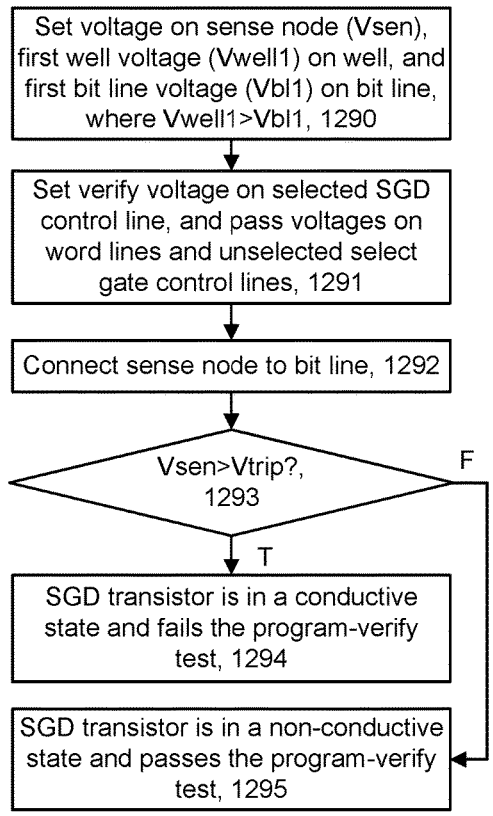
FIG. 12E depicts a flowchart of an example process for performing a program-verify test for a select gate transistor, consistent with step 1255 of FIG. 12C.

FIG. 12E depicts a flowchart of an example process for performing a program-verify test for a select gate transistor, consistent with step 1255 of FIG. 12C. This process biases the SGD transistor so that an Iwell-bl current flows when the SGD transistor is in a conductive state. Step 1290 sets a voltage on a sense node (Vsen), a first well voltage (Vwell1) on the well region of the substrate, and a first bit line voltage (Vbl1) on a bit line of the selected NAND string, where Vwell1>Vbl1. Since the bit line is at a lower bias than the well region, a current will flow from the well region to the bit line when the SGD transistor is in a conductive state. Step 1291 sets a verify voltage on the selected SGD control line and pass voltages on the word lines and the unselected select gate control lines. Step 1292 connects the sense node to the bit line, such as by turning on one of the switches 923 and 943 in FIG. 9.

In one approach, Vbl1 and Vsen are equal or similar and are both less than Vwell1 and Vtrip. Vwell1 could be a power supply voltage, Vdd, of the memory device.

A decision step 1293 determines if Vsen>Vtrip. Vtrip can be different for the sensing of the SGD transistor compared to the sensing of the memory cell in FIG. 12D. If the decision step is true, the SGD transistor is in a conductive state and fails the program-verify test (step 1294). In this case, the level of the sense node increases due to the transfer of the well voltage (Vwell1) to the bit line and the sense node. If the decision step is false, the SGD transistor is in a non-conductive state and passes the program-verify test (step 1295). In this case, there is not a significant increase in the sense node and it remains at a relatively low level which is less than Vtrip. See also FIG. 14A to 14G.

To perform the program-verify test for the select gate transistor, the sense circuit is configured to connect a sense node of the sense circuit to the bit line while judging an amount of current which flows from the well region to the bit line based on the voltage of the sense node, wherein the sense circuit determines that the select gate transistor is in a non-conductive state when the voltage of the sense node is below a respective trip voltage. The amount of current is greater when the voltage of the sense node is higher.

This program-verify test uses a source-follower type of sensing. The top side of the SGD transistor is the source and the bottom side is the drain, where the current flows from the drain to the source. A portion of the well voltage at the source is passed to the drain based on the level of the control gate voltage, VvSGD, so that the source voltage follows the control gate voltage. Further, voltage sensing can be used which does not involve sensing a voltage drop which is tied to a fixed current. Instead, voltage sensing involves determining whether charge sharing occurs between the sense node and the bit line.

FIG. 13A to 13E depict voltages in a program operation for memory cells, consistent with the process of FIGS. 12B and 12D. The horizontal direction indicates a common time line and the vertical direction denotes a voltage.

FIG. 13A depicts a voltage of a selected word line (Vwl_sel). In this example, program-verify tests are performed using verify voltages of VvA and VvB. Vwl_sel is initially at Vss (e.g., 0 V), then is set at VvA from t2-t5 and VvB from t5-t9, before returning to Vss.

FIG. 13B depicts a voltage of unselected word lines (Vwl_unsel). Vwl_unsel is initially at Vss, then is set at Vpass (e.g., 8-10 V) from t0-t9, before returning to Vss.

FIG. 13C depicts a voltage of select gate transistors for a selected sub-block (Vsgd/sgs_selSB) and for an unselected sub-block (Vsgd/sgs_unselSB). This assumes there is a selected sub-block in which programming occurs and one or more other unselected sub-blocks in which programming does not occur, in the current program operation. Vsgd and Vsgs are assumed to be the same, as a simplification. Additionally, Vsgd is assumed to be used for multiple SGD transistors in a NAND string, if applicable. Vsgd/sgs_selSB is initially at Vss, then is set at Vsgd_pass (e.g., 6-8 V) from t2-t9 (plot 1305), before returning to Vss. Vsgd/sgs_unselSB (plot 1306) remains at Vss.

FIG. 13D depicts a voltage of bit lines (Vbl) and sense nodes (Vsen). The voltages are represented by Vbl_sel and Vsen_sel for a selected NAND string, and Vbl_unsel and Vsen_unsel for an unselected NAND string. Note that the selected NAND strings are in the selected sub-block, while the unselected NAND strings can be in the selected sub-block as well as the unselected sub-blocks.

Vbl_sel and Vsen_sel are initially at Vss, then increase to a level such as 2-3 V from t1-t9, then return to Vss. Additionally, the sense node is connected to the bit line at a sense time during each verify voltage, such as by turning on the switches 923 and 943 in FIG. 9. For example, this connection occurs from t3-t5 during VvA and from t6-t8 during VvB. Additionally, a sense time is t4 during VvA and t7 during VvB. If Vsen remains above Vtrip at t4 (plot 1310), the memory cells pass the A-state program-verify test. If Vsen remains above Vtrip at t7 (plot 1310), the memory cells pass the B-state program-verify test. Plots 1311 and 1312 show Vsen when it falls below Vtrip. Vbl_unsel and Vsen_unsel remain at Vss (plot 1313).

FIG. 13E depicts a voltage of a well region of a substrate (Vwell). Vwell may remain at Vss during the program-verify test, as an example.

FIG. 14A to 14G depict voltages in a program operation for select gate transistors, consistent with the process of FIGS. 12A and 12C. The horizontal direction indicates a common time line and the vertical direction denotes a voltage.

FIG. 14A depicts a voltage of a selected word line. Vwl_sel is initially at Vss, then increase to the verify voltage of VvSGD from t2-t5, then returns to Vss.

FIG. 14B depicts a voltage of unselected word lines. Vwl_unsel is initially at Vss, then increases to Vpass from W45, then returns to Vss.

FIG. 14C depicts a voltage of select gate transistors. Vsgd/sgs_selSB is the voltage for SGD and SGS transistors in a selected sub-block in which the programming occurs, and Vsgd/sgs_unselSB is the voltage for SGD and SGS transistors in unselected sub-blocks in which the programming does not occur. Vsgd/sgs_selSB is initially at Vss, then is set at Vsgd_pass (e.g., 6-8 V) from t2-t9 (plot 1405), before returning to Vss. Vsgd/sgs_unselSB (plot 1406) remains at Vss.

FIG. 14D depicts a voltage of unselected bit lines. Vbl_unsel is set to Vss but can be temporarily coupled up (plot 1410) due to an increase in the voltage on an adjacent, selected bit line. This increase is due to a transfer of Vwell to the selected bit line when the select gate transistor is in a conductive state. The increase in Vbl_sel can be capacitively coupled to the adjacent unselected bit line to increase Vbl_unsel. Due to this likelihood of coupling up, the program-verify test for the SGD transistors can be performed separately for the odd and even-numbered NAND strings. For example, assume the program-verify test is for the NAND strings connected to BL0, BL2, In this case, the coupling up can occur on BL1, BL3, . . . . In another approach, if the coupling up is relatively small, the program-verify tests for the SGD transistors can be performed concurrently for all of the selected NAND strings. Plot 1411 represents the case of no coupling up of Vbl_unsel.

The arrow 1420 represents the coupling up of Vbl_unsel due to the increase in Vbl_sel. Further, the arrow 1423 represents the increase of Vbl_sel due to the increase in Vwell when the SGD transistor is in a conductive state.

FIG. 14E depicts a voltage of a selected bit line. Vbl_sel is initially at a low voltage such as Vss and can be driven higher (plot 1415) to a level which is comparable to Vwell when the SGD transistor is in a conductive state. If the SGD transistor is in a non-conductive state, Vbl_sel can remain at Vss (plot 1416).

FIG. 14F depicts a voltage of a well region of a substrate. Vwell transitions from Vss to a higher level such as 2-3 V at t1 then returns to Vss at t6. As mentioned, Vwell can be passed to Vbl_sel, as represented by arrow 1423, when the SGD transistor is in a conductive state, in a given NAND string.

FIG. 14G depicts a voltage of a sense node. Vsen can be increased from Vss to a higher level at t1 which is compared to Vwell and the higher level of Vbl_sel at plot 1415. At t3, the sense node is connected to the bit line and can discharge, as depicted by plot 1431, or remain at the higher level (plot 1430). Vsen can be compared to Vtrip at a sense time of t4. If Vsen<Vtrip, the SGD transistor is in a non-conductive state. In this case, Vbl_sel remains low (plot 1416) since Vwell is not transferred to Vbl_sel, so that the sense node discharges. If Vsen>=Vtrip, indicating Vwell is transferred to Vbl_sel, the SGD transistor is in a conductive state. In this case, Vbl_sel goes high (plot 1415) so that the sense node is prevented from discharging below Vtrip. The arrow 1421 represents how Vsen will remain high when Vbl_sel is high, and the arrow 1422 represents how Vsen will discharge when Vbl_sel is low.

FIG. 15 depicts the region 699 of a stack of FIG. 6C, showing the implantation of dopants into the channel layer. Example dopants are depicted by circles and include n-type dopants 1526 and 1527 and p-type dopants 1528. The top 616a of the stack is depicted, along with the layers 663, 664, 665 and 660 and a dielectric core material 666. Top surfaces 1513, 1514, 1515 and 1516 of the SGD0, DL18, SGD1 and DL17 layers, respectively, are also depicted. The figure also shows heights z0, z1, z2, z3 and z4 in the stack, above the substrate, which correspond to the top surfaces 1516, 1515, 1514, 1513 and 616a, respectively. The SGD0 and SGD1 layers include the SGD transistors 718 and 717, respectively. The surfaces 1513 and 1514 are also the top and bottom surface, respectively, of the SGD transistor 718.

As mentioned, the fabrication of the memory device includes forming a stack of alternating control gate layers and dielectric layers, forming memory holes in the stack, depositing the layers along the sidewall of the memory hole and filling in a remainder of the memory hole with a dielectric material. Additional processing can involve forming a conductive path from the channel layer 660 to the bit line which is formed above the stack.

Additionally, an n-type dopant such as Arsenic or Phosphorus can be provided in the portion 696 of the channel layer which is adjacent to DL19, between the top of the stack and the top of the topmost SGD transistor, to increase the conductivity of this portion of the channel layer and help provide a conductive path from the remaining, lower portion of the channel layer to the top of the stack and the bit line. Moreover, a p-type dopant such as Boron can be provided in the portions 698 and 697 of the channel layer which are adjacent to SGD0 and SGD1, respectively. This increases the Vth of the associated SGD transistors above the intrinsic level to reduce data retention loss. For example, after the doping, the SGD transistors may have a Vth of about 1.5 V. The SGD transistors can subsequently be programmed to increase the Vth to about 3 V, for example. If there is data retention loss, the Vth could then decrease as low as 1.5 V instead of to the lower intrinsic level. The channel regions of the multiple SGDs transistors can be doped with a similar dopant concentration so that they can be programmed and verified together, in one approach, and treated as one long channel device made up of multiple short channel devices.

The portion 698 of the channel layer in the SGD transistor 718 includes a top half 698t and a bottom half 698b. The p-type dopant may also be provided in the portion 695 of the channel layer which is adjacent to DL18 since this portion is between SGD0 and SGD1 and it easier to implant the dopant in the region of the channel layer spanning SGD1 to SGD0 than to precisely target it in SGD1 to SGD0 while omitting DL18.

The dopants can be provided using ion implantation, for example, followed by a heating step. The ion implantation involves bombarding high energy dopants into the stack. It is acceptable for some of the dopants to enter the silicon dioxide of the core since its bandgap is much higher than that of the polysilicon channel and electrical current does not flow through the core. The depth of the ion implantation into the channel layer can be controlled based on factors such as the energy used for implantation, the doping species and its diffusivity, and the annealing temperature. The implantation of the p-type dopant should not extend down to the portions of the channel layer in the memory cells. An appropriate margin can be provided by providing a larger height for the dielectric layer which is just below the bottom SGD transistor, e.g., DL17 in this example.

The n-type dopant should extend down to the top surface of the topmost SGD layer, e.g., SGD0. If the n-type dopant does not extend down to the top surface of SGD0, the channel region at the top surface will have a high resistance since it can only be turned on by the fringing field of the SGD control gate voltage. In this case, the SGD transistor will have an undesirable low current when it is turned on. On the other hand, if the n-type dopant reaches too far into SGD0, the Vth of the SGD transistor will decrease based on the short channel effect. The n-type dopant should just slightly reach the top-most SGD transistor to avoid a low on-current without decreasing the Vth too much. Due to the n-type dopant at the top of the SGD0 transistor, it will have a non-uniform doping concentration in its channel layer. See also FIG. 16.

A doped channel portion may have a carrier (hole or electron) concentration of about 10^13 to 10^18 cm-3. An undoped channel portion may have a carrier concentration of no more than about 1.5×10-10 cm-3.

FIG. 16 depicts a plot of height in a stack versus dopant concentration, consistent with FIG. 15. The z-axis is aligned with the region 699 of the stack of FIG. 15. Plot 1531 depicts a p-type doping concentration and plot 1530 depicts an n-type doping concentration. As mentioned, various factors affect the uniformity of the ion implantation of the p-type and n-type dopants, including the energy, duration and angle of the implantation. In this example, a higher concentration of the n-type dopant is seen for the top half 698t than for the bottom half 698b of the channel layer adjacent to the SGD0 layer. Also, a lower concentration of the p-type dopant may be seen for the top half 698t than for the bottom half 698b. The doping concentration is therefore non-uniform in the portion 698 of the channel layer in the SGD transistor 718. In one approach, the doping concentration is uniform in the portion 697 of the channel layer in the SGD transistor 717. In another approach, a lower concentration of the p-type dopant may be seen for the bottom half than for the top half of the portion 697 of the channel layer.

Due to the non-uniformity in the dopant concentration in the channel layer in the topmost SGD transistor in a NAND string, the transistor will have a different Vth according to which side it is biased from, e.g., the top or bottom side. One possible scenario is that the bottom half of the SGD transistor is subject to a short channel effect when the SGD transistor is biased from the bottom, e.g., when Vwell>Vbl in a program-verify test. Biasing the SGD transistor in this way can result in the final Vth (see Vth distribution 1110 in FIG. 11B) being higher than the case where the SGD transistor is biased from the top, e.g., when Vbl>Vwell in a program-verify test (see Vth distribution 1111 in FIG. 11B).

In one implementation, an apparatus comprises: a substrate comprising a well region; a NAND string extending vertically and comprising a top end and a bottom end, the bottom end is connected to the well region and the top end is connected to a bit line, the NAND string also comprising a memory cell and a select gate transistor, wherein the select gate transistor is at the top end of the NAND string; and a control circuit configured to perform a program-verify test for the select gate transistor by providing a first well voltage on the well region which is higher than a first bit line voltage on the bit line, and perform a program-verify test for the memory cell by providing a second well voltage on the well region which is less than a second bit line voltage on the bit line, wherein the second well voltage is less than the first well voltage.

In another implementation, a method comprises: programming a select gate transistor in a NAND string, the NAND string comprising a top end connected to a bit line and a bottom end connected to a well region of a substrate, the programming the select gate transistor comprises judging an amount of current flowing from the well region to the bit line during a program-verify test; and programming a memory cell in the NAND string, the programming the memory cell comprises judging an amount of current flowing from the bit line to the well region during a program-verify test.

In another implementation, an apparatus comprises: a substrate comprising a well region; a set of connected transistors comprising a top end connected to a bit line and a bottom end connected to the well region, the set of connected transistors comprising a memory cell and a select gate transistor; means for judging an amount of current flowing from the well region to the bit line during a program-verify test for the select gate transistor; and means for judging an amount of current flowing from the bit line to the well region during a program-verify test for the memory cell.

The means for judging an amount of current flowing from the well region to the bit line and the means for judging an amount of current flowing from the bit line to the well region, may include the power control circuit 116, control circuitry 110 and controller 122 of FIG. 1, the sense block SB0 of FIGS. 2 and 3 and the sense circuits of FIG. 9, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a substrate comprising a well region;
a NAND string extending vertically and comprising a top end and a bottom end, the bottom end is connected to the well region and the top end is connected to a bit line, the NAND string also comprising a memory cell and a select gate transistor, wherein the select gate transistor is at the top end of the NAND string; and
a control circuit configured to perform a program-verify test for the select gate transistor by providing a first well voltage on the well region which is higher than a first bit line voltage on the bit line, and perform a program-verify test for the memory cell by providing a second well voltage on the well region which is less than a second bit line voltage on the bit line, wherein the second well voltage is less than the first well voltage.

2. The apparatus of claim 1, wherein:
the control circuit comprises a sensing circuit connected to the NAND string;
to perform the program-verify test for the memory cell, the sense circuit is configured to connect a sense node of the sense circuit to the bit line while judging an amount of current which flows from the bit line to the well region based on a voltage of the sense node, wherein the sense circuit determines that the memory cell is in a conductive state when the voltage of the sense node is below a respective trip voltage; and
to perform the program-verify test for the select gate transistor, the sense circuit is configured to connect a sense node of the sense circuit to the bit line while judging an amount of current which flows from the well region to the bit line based on the voltage of the sense node, wherein the sense circuit determines that the select gate transistor is in a non-conductive state when the voltage of the sense node is below a respective trip voltage.

3. The apparatus of claim 1, wherein:
the program-verify test for the select gate transistor is performed concurrently for select gate transistors in even-numbered NAND strings in a set of NAND strings, and separately, concurrently for select gate transistors in odd-numbered NAND strings in the set of NAND strings.

4. The apparatus of claim 3, wherein:
the program-verify test for the memory cell is performed concurrently for memory cells in the even-numbered NAND strings and the odd-numbered NAND strings in the set of NAND strings.

5. The apparatus of claim 1, wherein:
a channel layer extends in the NAND string; and
a portion of the channel layer above the select gate transistor comprises an n-type dopant and a portion of the channel layer in the select gate transistor comprises a p-type dopant.

6. The apparatus of claim 5, wherein:
a portion of the channel layer at a top half of the select gate transistor comprises the n-type dopant.

7. The apparatus of claim 5, wherein:
a concentration of the n-type dopant in a top half of the select gate transistor is greater than a concentration of the n-type dopant in a bottom half of the select gate transistor.

8. The apparatus of claim 1, wherein:
a channel layer extends in the NAND string; and
a portion of the channel layer in the select gate transistor is non-uniformly doped.

9. The apparatus of claim 8, wherein:
a portion of the channel layer in the memory cell is undoped.

10. The apparatus of claim 1, wherein:
the select gate transistor is a topmost select gate transistor which is above another select gate transistor, and the another select gate transistor is above the memory cell; and
the control circuit is configured to perform a program-verify test for the another select gate transistor by providing the first well voltage on the well region and the first bit line voltage on the bit line.

11. The apparatus of claim 1, wherein:
the control circuit is configured to sense a threshold voltage distribution of a set of select gate transistors using a current which flows from the well region to the bit line, and to program the select gate transistor in response to a determination that a specified portion of a set of select gate transistors have a threshold voltage below a lower demarcation level.

12. A method, comprising:
programming a select gate transistor in a NAND string, the NAND string comprising a top end connected to a bit line and a bottom end connected to a well region of a substrate, the programming the select gate transistor comprises judging an amount of current flowing from the well region to the bit line during a program-verify test; and
programming a memory cell in the NAND string, the programming the memory cell comprises judging an amount of current flowing from the bit line to the well region during a program-verify test.

13. The method of claim 12, wherein:
the NAND string comprises a channel layer; and
a doping concentration in a portion of the channel layer at a top of the select gate transistor is different than a doping concentration in a portion of the channel layer at a bottom of the select gate transistor.

14. The method of claim 12, wherein:
the programming of the select gate transistor occurs in multiple program loops; and
the judging of the amount of current flowing from the well region to the bit line occurs during a program-verify test in each of the multiple program loops.

15. The method of claim 12, wherein:
the NAND string is in a block;
the programming of the select gate transistor occurs before user data is stored in the block; and
the programming of the memory cell involves programming user data into the memory cell.

16. The method of claim 12, wherein:
a channel layer extends in the NAND string; and
a portion of the channel layer in the select gate transistor is non-uniformly doped.

17. An apparatus, comprising:
a substrate comprising a well region;
a set of connected transistors comprising a top end connected to a bit line and a bottom end connected to the well region, the set of connected transistors comprising a memory cell and a select gate transistor;
means for judging an amount of current flowing from the well region to the bit line during a program-verify test for the select gate transistor; and
means for judging an amount of current flowing from the bit line to the well region during a program-verify test for the memory cell.

18. The apparatus of claim 17, wherein:
the means for judging the amount of current flowing from the well region to the bit line, and the means for judging the amount of current flowing from the bit line to the well region, comprise sense circuit connected to the bit line, the sense circuit, to perform the judging of the amount of current which flows from the bit line to the well region, and the judging of the amount of current which flows from the well region to the bit line, is configured to connect a sense node of the sense circuit to the bit line while determining a voltage of the sense node.

19. The apparatus of claim 17, wherein:
the set of connected transistors comprises a channel layer; and
a doping concentration in the channel layer at a top of the select gate transistor is greater than a doping concentration in the channel layer at a bottom of the select gate transistor.

20. The apparatus of claim 17, wherein:
the set of connected transistors comprises a channel layer; and
a doping concentration in the channel layer at a top of the select gate transistor is different than a doping concentration in the channel layer at a bottom of the select gate transistor.

* * * * *